United States Patent
Kwon et al.

(10) Patent No.: US 9,646,687 B2
(45) Date of Patent: May 9, 2017

(54) RESISTIVE MEMORY DEVICE AND OPERATING METHOD

(71) Applicants: Hyo-Jin Kwon, Seoul (KR); Yeong-Taek Lee, Seoul (KR); Dae-Seok Byeon, Seongnam-si (KR); Yong-Kyu Lee, Hwaseong-si (KR); Hyun-Kook Park, Anyang-si (KR)

(72) Inventors: Hyo-Jin Kwon, Seoul (KR); Yeong-Taek Lee, Seoul (KR); Dae-Seok Byeon, Seongnam-si (KR); Yong-Kyu Lee, Hwaseong-si (KR); Hyun-Kook Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 151 days.

(21) Appl. No.: 14/619,992

(22) Filed: Feb. 11, 2015

(65) Prior Publication Data

US 2015/0363257 A1 Dec. 17, 2015

(30) Foreign Application Priority Data

Jun. 16, 2014 (KR) ........................ 10-2014-0072973

(51) Int. Cl.
*G06F 11/07* (2006.01)
*G11C 13/00* (2006.01)
*G11C 29/52* (2006.01)

(52) U.S. Cl.
CPC ...... *G11C 13/0033* (2013.01); *G11C 13/0035* (2013.01); *G11C 13/0069* (2013.01);
(Continued)

(58) Field of Classification Search
CPC .. G06F 11/10; G06F 11/1048; G06F 12/0238; G06F 2212/2024;
(Continued)

(56) References Cited

U.S. PATENT DOCUMENTS 4,718,041 A * 1/1988 Baglee .................. G11C 16/10
365/185.09
6,972,985 B2 12/2005 Rinerson et al.
(Continued)

FOREIGN PATENT DOCUMENTS

EP 2204813 B1 9/2012
WO WO2011022123 A1 2/2011

OTHER PUBLICATIONS

Higuchi et al., "50NM HFO2 RERAM With 50-Times Endurance Enhancement by Set Reset Turnback Pulse & Verify Scheme," Extended Abstracts of the 2011 International Conference on Solid State Devices and Materials, Nagoya, 2011, pp. 1011-1012.
(Continued)

*Primary Examiner* — Nadeem Iqbal
(74) *Attorney, Agent, or Firm* — Volentine & Whitt, PLLC

(57) ABSTRACT

Provided are a resistive memory device and an operating method for the resistive memory device. The operating method includes detecting a write cycle, determining whether or not to perform a recovery operation by comparing the detected write cycle with a first reference value, and upon determining to perform the recovery operation, performing the recovery operation on target memory cells of the memory cell array.

20 Claims, 17 Drawing Sheets

(52) U.S. Cl.
CPC ...... *G11C 29/52* (2013.01); *G11C 2013/0092* (2013.01); *G11C 2213/77* (2013.01)

(58) Field of Classification Search
CPC ........ G06F 2212/7203; G11C 13/0033; G11C 13/0035; G11C 13/0002; G11C 2013/0054; G11C 2013/009
See application file for complete search history.

(56) References Cited

U.S. PATENT DOCUMENTS

| | | | |
|---|---|---|---|
| 7,319,053 B2 | 1/2008 | Subramanian et al. | |
| 7,668,002 B2 | 2/2010 | Kinoshita et al. | |
| 8,193,573 B2 | 6/2012 | Bronner et al. | |
| 8,243,496 B2 * | 8/2012 | Kim | G11C 8/12 365/148 |
| 8,344,475 B2 | 1/2013 | Shaeffer et al. | |
| 8,395,925 B2 * | 3/2013 | Kawai | G11C 13/0007 365/148 |
| 8,488,366 B2 * | 7/2013 | Kurosawa | G11C 13/0004 365/148 |
| 8,497,544 B2 | 7/2013 | Bronner et al. | |
| 9,009,531 B2 * | 4/2015 | Mozak | G11C 29/02 714/32 |
| 9,208,028 B2 * | 12/2015 | Oh | G06F 11/141 |
| 2006/0250836 A1 | 11/2006 | Herner et al. | |
| 2010/0220512 A1 | 9/2010 | Chen et al. | |
| 2011/0193043 A1 | 8/2011 | Chin | |
| 2011/0289385 A1 * | 11/2011 | Takeuchi | G06F 11/1068 714/764 |
| 2012/0327708 A1 * | 12/2012 | Du | G11C 13/0021 365/163 |
| 2013/0010527 A1 | 1/2013 | Ma et al. | |
| 2013/0148437 A1 | 6/2013 | Bronner et al. | |
| 2013/0250651 A1 | 9/2013 | Sills | |
| 2013/0304980 A1 | 11/2013 | Nachimuthu et al. | |
| 2014/0143474 A1 * | 5/2014 | Damle | G06F 12/0246 711/103 |
| 2014/0157053 A1 * | 6/2014 | Mozak | G11C 29/02 714/32 |
| 2014/0185360 A1 * | 7/2014 | Kawai | G11C 13/0007 365/148 |
| 2014/0254286 A1 | 9/2014 | Bronner et al. | |

OTHER PUBLICATIONS

Higuchi et al., "Investigation of Verify-Programming Methods to Achieve 10 Million Cycles for 50NM HFO2 RERAM," 2012 IEEE.

\* cited by examiner

RESISTIVE MEMORY DEVICE AND OPERATING METHOD

CROSS-REFERENCE TO RELATED APPLICATIONS

This application claims the benefit of Korean Patent Application No. 10-2014-0072973 filed on Jun. 16, 2014, the subject matter of which is hereby incorporated by reference.

BACKGROUND

The inventive concept relates generally to resistive memory devices and operating methods for resistive memory devices. More particularly, the inventive concept relates to resistive memory devices capable of efficiently and effectively performing a recovery operation on a specific set of target resistive memory cells.

Market demands for non-volatile memory devices that offer high data storage capacity and low power consumption continue to drive research into so-called next-generation memory devices. Such next-generation memory devices are expected to provide the high memory cell integrity density of Dynamic Random Access Memory (DRAM), the non-volatile data storage capabilities of flash memory and the high data access speed of a static RAM (SRAM). Next-generation memory devices include, for example, the Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM).

SUMMARY

The inventive concept provides a resistive memory device having improved data reliability and an operating method of the resistive memory device.

According to an aspect of the inventive concept, there is provided an operating method of a resistive memory device including a memory cell array, the operating method including operations of detecting a write cycle; determining whether to perform a recovery operation, according to whether the write cycle reaches a preset first reference value; and performing the recovery operation on one or more memory cells of the memory cell array, based on a result of the determining.

The operating method may further include operations of increasing a counting value indicating the write cycle, whenever a write command is received; and resetting the counting value when the recovery operation has been performed, wherein, when the counting value reaches the first reference value, the recovery operation is performed.

The memory cell array may include a plurality of cell regions, and according to a result of checking one or more bits of a received address, a recovery operation may be separately performed on each of the plurality of cell regions.

When a write cycle of a cell region that includes a memory cell selected by the address reaches the first reference value, the recovery operation may be performed on the cell region.

When a write cycle of a memory cell selected by the address reaches the first reference value, the recovery operation may be performed on a cell region that includes the memory cell.

The operation of performing the recovery operation may include operations of temporarily storing data read from the one or more memory cells of the memory cell array; applying a recovery pulse to the one or more memory cells; and writing the temporarily-stored data to the one or more memory cells.

The operating method may further include operations of reading data for a verification operation corresponding to a write command; performing error detection on the read data; and determining whether to perform the recovery operation, based on a result of the error detection.

When the number of errors that occurred in the read data is greater than a preset second reference value, the recovery operation may be performed.

A first recovery operation and a second recovery operation may be sequentially performed, and at least one selected from a pulse width and a pulse level of a second recovery pulse used in the second recovery operation may be different from a pulse width and a pulse level of a first recovery pulse used in the first recovery operation.

According to another aspect of the inventive concept, there is provided an operating method of a resistive memory device, the operating method including operations of reading data stored in a memory cell array, in response to a first command; determining whether to perform a recovery operation, according to a result of error detection with respect to the read data; and performing the recovery operation on one or more memory cells of the memory cell array, based on a result of the determining.

According to another aspect of the inventive concept, there is provided a resistive memory device including a memory cell array including resistive memory cells; and a control logic for controlling a write operation, a read operation, and a recovery operation with respect to the memory cell array and determining whether to perform a recovery operation on the memory cell array, based on at least one selected from a result of detecting a write cycle and a result of error detection with respect to read data.

According to another aspect of the inventive concept, there is provided a resistive memory device including a memory cell array including resistive memory cells; a control logic for controlling a write operation and a read operation with respect to the memory cell array; and a recovery controller for determining whether to perform a recovery operation on the memory cell array, based on at least one selected from a result of detecting a write cycle and a result of error detection performed on read data.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Embodiments of the inventive concept will now be described in some additional detail with reference to the accompanying drawings. The inventive concept may, however, be embodied in many different forms, and should not be construed as being limited to only the illustrated embodiments. Throughout the written description and drawings, like reference number refer to like or similar elements.

All examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

Figure 1:
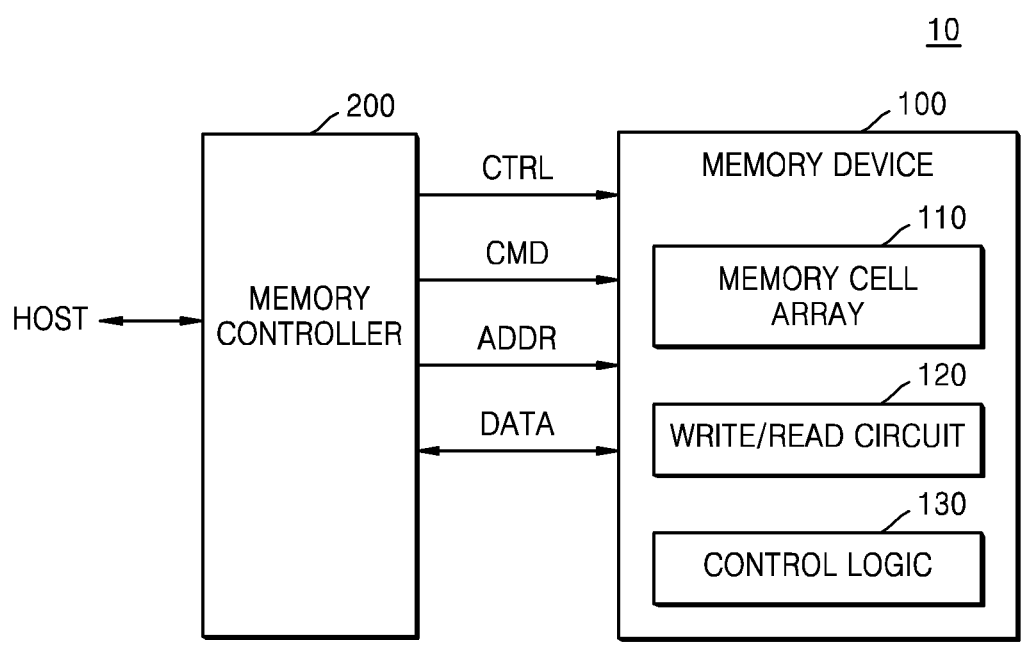
FIG. 1 is a block diagram of a memory system including a resistive memory device according to an embodiment of the inventive concept.

FIG. 1 is a block diagram of a memory system 10 including a resistive memory device 100 according to an embodiment of the inventive concept.

Referring to FIG. 1, the memory system 10 generally comprises the resistive memory device 100 (hereinafter, referred to as the "memory device 100") and a memory controller 200. The memory device 100 includes a memory cell array 110, a write/read circuit 120, and control logic 130. In the illustrated example of FIG. 1 since the memory cell array 110 includes resistive memory cells, the memory system 10 may be referred to as a resistive memory system.

In response to a read request received from a host (not shown), the memory controller 200 will cause "read data" to be retrieved from the memory device 100. Alternately, in response to a write request received from the host, the memory controller 200 will cause related "write data" to be written (or programmed) to the memory device 100. That is, the memory controller 200 will provide the necessary address information (ADDR), one or more command(s) (CMD), and/or one or more control signal(s) (CTRL) to the memory device 100 sufficient to execute a read operation, a write operation, or an erase operation with respect to the memory device 100. In this manner, designated write data and/or read data (DATA) may be exchanged between the memory controller 200 and memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) using at least one of various interface protocols including USB, MMC, PCI-E, ATA (Advanced Technology Attachment), Serial-ATA, Parallel-ATA, SCSI, ESDI, and Integrated Drive Electronics (IDE).

The memory cell array 110 includes a plurality of memory cells (not shown) respectively disposed at intersections between first signal lines and second signal lines. In the illustrated embodiment of FIG. 1 it is assumed that the first signal lines are bit lines, and the second signal lines are word lines. However, these designations of first and second signal lines may be reversed.

Each of the memory cells arranged in the memory cell array 110 may be a single level cell (SLC) configured to store a single data bit per memory cell, or a multilevel cell (MLC) configured to store two or more data bits per memory cell. In some embodiments, the memory cell array 110 may include both SLC and MLC. Continuing forward with the assumption of resistive memory cells being arranged in the memory cell array 110, a single data bit may be written to a SLC using two (2) resistance level distributions respectively associated with data values of "1" and "0". In like manner, multi-bit data ("N") may be written to a MLC using $2^N$ resistance level distributions respectively associated with data values of "0" through "$(2^N-1)$". Thus, 2-bit data will be written according to four (4) respective resistance level distributions, 3-bit data will be written according to eight (8) respective resistance level distributions, etc.

In the illustrated embodiment of FIG. 1, the memory cell array 110 is assumed to be implemented with a two-dimensional (or horizontal) structure. However, another embodiments of the inventive concept may include one or more memory cell array(s) implemented in a three-dimensional (or vertical) structure.

However, specifically configured, the memory cell array 110 may include resistance-type memory cells or resistive memory cells that include a variable resistor device (not shown) having a variable resistor. In one example, when the resistance of the variable resistor device is defined in relation to a phase-changeable material, such as Ge—Sb—Te, that changes one or more material states in response to an applied temperature, the constituent resistive memory device may be referred to as a Phase change RAM (or PRAM). In another example, when the resistance of the variable resistor device is defined in relation to a complex metal oxide including (e.g.,) an upper electrode, a lower electrode, and transition metal oxide there between, the resistive memory device may be referred to as a Resistive RAM (RRAM). In still another example, when the resistance of the variable resistor device is defined in relation to an upper electrode of a magnetic material, a lower electrode of the magnetic material, and a dielectric there between, the resistive memory device may be referred to as a Magnetic RAM (MRAM).

The write/read circuit 120 performs write and read operations on the memory cells. The write/read circuit 120 is connected to the memory cells via the bit lines, and may include a write driver that writes data to the memory cells, and a sense amplifier that amplifies data read from the memory cells.

The control logic 130 may be used to control the execution of operations in relation to the memory device 100. In this regard, the control logic may be used to control the write/read circuit 120 to execute various operations, such as write, read and erase operations. Also, in order to prevent degradation in the reliability of stored data due to the conventionally understood "reset wear out phenomenon", the control logic 130 may be used to control the periodic execution of a so-called "recovery operation" with respect to the memory cells. Both the reset wear out phenomenon and related recovery operation will be described in some additional detail hereafter.

In a resistive memory device such as an RRAM, an iteratively-executed write cycle is used to perform a write operation. That is, a number of write operations will be executed iteratively until write data is properly programmed in the memory device 100. However, this iterative (or incrementally executed number of write cycles) approach may result in the reset wear out phenomenon occurring. In the reset wear out phenomenon, when a reset write operation is performed to change the state of a target memory cell to a defined reset state (i.e., a high resistance state), a filament associated with the target memory cell may not be "cut" in a manner sufficient to enable the state of the memory cell to be changed to the reset state. The effects of the reset wear out phenomenon may be mitigated by applying a so-called "recovery pulse" to the target memory cell, where the recovery pulse is greater than the reset write pulse normally applied during the reset write operation.

In the context of the illustrated embodiment of FIG. 1, the control logic 130 may be used to control the execution of a recovery operation directed to one or more memory cells of the memory device 100. That is, the control logic 130 may be used to appropriately define the recovery operation such that the voltage "level" and/or application duration "width" of the requisite recovery pulse is sufficient to accomplish the recovery operation. Thus, the control logic 130 controls the timing of the recovery operation and may be used to monitor memory operations (e.g., write and/or read operations) directed to the memory device 100. The control logic 130 may also be used to determine whether or not it is necessary to perform a recovery operation in relation to the memory cell array 110 of the memory device 100.

In related embodiments, the memory cell array 110 may include a number of designated memory cell regions, and the control logic 130 may perform the recovery operation according to memory cell region units. In such circumstances, the control logic 130 may be used to determine whether or not execution of a recovery operation is necessary for each respective memory cell region by monitoring at least one "memory operation" (e.g., a read, write, and/or erase operation) in relation to each memory cell region.

For example with reference to FIG. 1, when a write command is received from the memory controller 200, the control logic 130 may detect a write cycle with respect to the memory cell array 110, and may determine whether or not to perform a recovery operation, based on a result of the write cycle detection. For example, the control logic 130 may cause execution of the recovery operation with respect to a particular memory cell region whenever the write cycle with respect to the memory cell array 110 reaches a particular value (e.g., a first reference value). Thus, if the recovery operation is executed whenever a number of executed write operations reaches the first reference value, the control logic 130 may be used (e.g.,) to count a number received write commands. In this context, the counted "write cycle value" for a particular memory cell region, as generated by the control logic 130 and indicating a number of executed write operations, may be reset to zero when the recovery operation is performed.

In order to execute the recovery operation, control signals generated by the control logic 130 may be used to generate a corresponding recovery pulse. For example, the memory device 100 may include a pulse generator (not shown) configured to generate various pulse-type signals (or pulses) used during the write, read, erase and/or recovery operations. The pulse generator may be provided external to or as part of the control logic 130. The recovery operation directed to one or more memory cells of the memory cell array 110 may be performed by selectively applying the generated recovery pulse. As described above, the recovery operation may be performed in relation to all of the memory cells in the memory cell array 110, or some subset (e.g., a defined memory cell region) of the memory cells.

In certain embodiments of the inventive concept, the control logic 130 may be used to perform an error detection operation with respect to read data retrieved from one or more memory cells of the memory cell array 110. In this regard, a determination as to whether or not to perform the recovery operation may be based on the result(s) of the error detection operation. Thus, the execution of the recovery operation may be triggered by one or more conditions or events detected during the operation of the resistive memory system 10, such as the state of certain read data retrieved from the memory cell array 110, a number of data errors arising in retrieved read data, etc.

For example, during an error detection operation performed with respect to designated read data, a determination may be made as to whether or not a "reset fail bit" has occurred with respect to target memory cells. In this context, a reset write operation may be performed on target memory cells having relatively low resistance(s). Then, it is possible to detect whether or not the resistance of the target memory cells has changed from relatively low state(s) to the high resistance state in response to the reset write operation. The number of reset fail bits detected in this manner from read data retrieved from the target memory cell following the reset write operation may be compared to a given reference value and the comparison may serve as a triggering event for execution of the recovery operation.

As noted above, the recovery operation may be performed on unit basis, where such "unit basis" is variably defined to include one or more memory cells of the memory cell array 110. For example, the memory cell array 110 may include a plurality of memory cell regions, wherein each memory cell region includes memory cells belonging to one or more "error detection units". Either one or both of the designated memory cell regions and the designated error detection units may serve as a "recovery operation unit". Thus, the recovery operation may be performed on a memory cell region unit basis and/or an error detection unit basis. In this regard, each error detection unit may be designated in response to a read command received from the memory controller 200 and causing execution of a read operation that is performed according to error detection units. Alternatively, in response to a write command received from the memory controller 200, a write operation may be performed on one or more memory cells of the memory cell array 110, where one or more error detection units may be retrieved during a constituent write verification operation. Thus, a determination as to whether or not a recovery operation should be executed may be made during read operations and/or write operations in relation to "target memory cells", where the target memory cells are processed during the recovery operation according to one or more of various memory cell grouping criteria including a read data unit, write data unit, memory cell region unit, error detection unit, write verification unit, etc.

The memory controller 200 and the memory device 100 of FIG. 1 may be commonly integrated within a semiconductor device. For example, the memory controller 200 and memory device 100 may be integrated and configured as a memory card, such as a PC card, PCMCIA card, compact flash card (CF card), smart media card (SM/SMC), memory stick, multimedia card—such as a MMC, RS-MMC, or MMCmicroO, SD card—such as a SD, miniSD, or microSD), universal flash storage (UFS), etc. In certain embodiments of the inventive concept, the memory controller 200 and memory device 100 may be integrated and configured a Solid State Disk/Drive (SSD).

Figure 2:
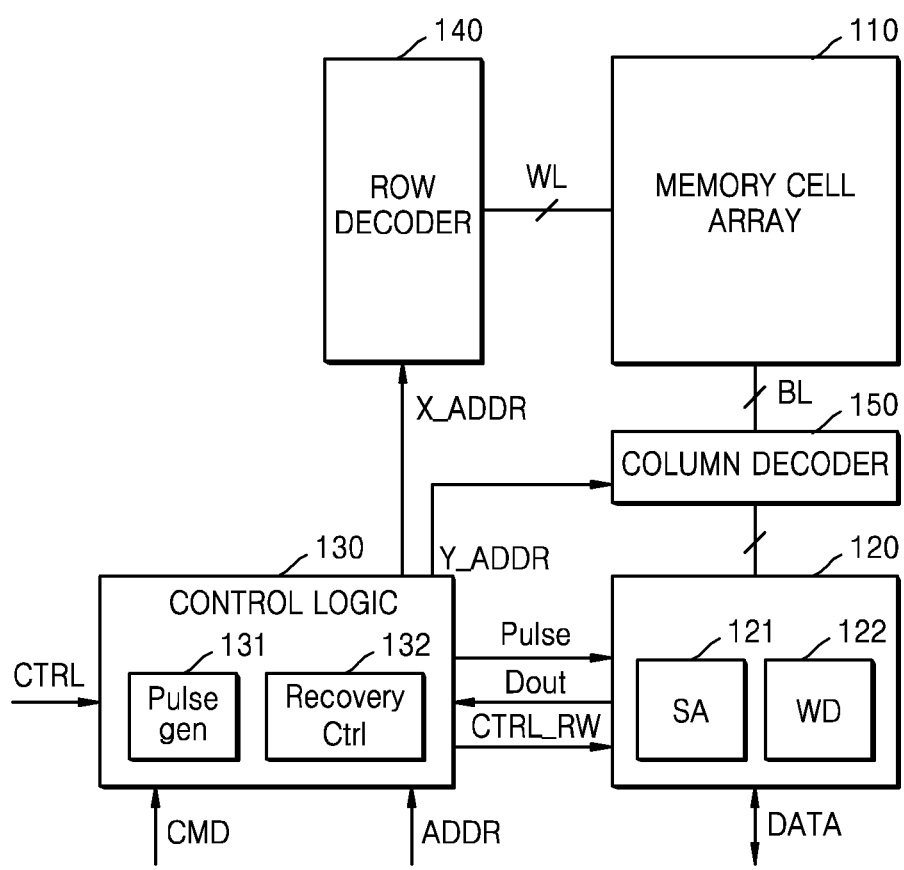
FIG. 2 is a block diagram of a memory device of FIG. 1, according to an embodiment of the inventive concept.

Exemplary operation of the memory device 100 within the resistive memory system 10 will be described hereafter, where FIG. 2 is a block diagram further illustrating in one example the memory device 100 of FIG. 1.

Referring to FIG. 2, the memory device 100 comprises the memory cell array 110, write/read circuit 120, and control logic 130. The memory device 100 further comprises a row decoder 140 and a column decoder 150. As illustrated in FIG. 2, the write/read circuit 120 may include a sense amplifier 121 and a write driver 122, and control logic 130 may include a pulse generator 131 and a recovery controller 132. However, at least one of the pulse generator 131 and recovery controller 132 may be disposed external to the control logic 130.

In this regard, the control logic 130 may be variously embodied in hardware and/or software so as to generally control the overall operation of the memory device 100. Thus, the functional scope of the control logic 130 are not limited to only those features described herein.

Here again, the memory cells of the memory cell array 110 may be arranged in relation to first signal lines and second signal lines (e.g., bit lines BL and word lines WL).

An address (ADDR) indicating target memory cells may be generated by the control logic 130. The address may include a row address (X_ADDR) for selecting a word line of the memory cell array 110, and a column address (Y_ADDR) for selecting a bit line of the memory cell array 110. The row decoder 140 performs a word line selecting operation in response to the row address, and the column decoder 150 performs a bit line selecting operation in response to the column address.

The write/read circuit 120 may be connected to a bit line BL and thus may write data to a memory cell or may read data from the memory cell. For example, the write/read circuit 120 may receive a write pulse (Pulse) from the control logic 130, and the write driver 122 may provide a write voltage or a write current to the memory cell array 110 via the column decoder 150 according to the received write pulse. That is, when a set pulse is received, the write driver 122 may provide a set current or a set voltage to the memory cell array 110 in response to the set pulse, and when a reset pulse is received, the write driver 122 may provide a reset current or a reset voltage to the memory cell array 110 in response to the reset pulse.

During a read operation, the write/read circuit 120 may generate and provide a read current (or a read voltage) for the read operation to a memory cell. The sense amplifier 121 may include a current generator (or a voltage generator), and in order to determine data, the sense amplifier 121 may include a comparator that is connected to a node (e.g., a sensing node) of the bit line BL. Since one end of the comparator is connected to the sensing node, and the other end of the comparator is connected to a reference voltage, the sense amplifier 121 may determine the value of the data.

The control logic 130 may output various control signals (CTRL_RW) for writing data to the memory cell array 110 or reading data from the memory cell array 110, based on a received command (CMD), address ADDR, and a control signal (CTRL) received from the memory controller 200. By doing so, the control logic 130 may generally control operations in the memory device 100. In the illustrated example of FIG. 2, a recovery operation with respect to target memory cell of the memory cell array 110 may be performed using different approaches. For example and as previously noted, the definition of the target memory cells may vary such that all of the resistive memory cells, or some of the resistive memory cells in the resistive memory cell array 110 are subjected to the recovery operation. Where only some of the resistive memory cells are subjected to the recovery operation, the nature of the recovery operation unit defining which resistive memory cells will be the target memory cells may be varied. Hence, the control signals provided by the control logic 130 will include one or more control signal(s) that define the nature and timing of the recovery operation according to embodiments of the inventive concept.

As illustrated in FIG. 2, the control logic 130 controlling the execution of the recovery operation with respect to the memory cell array 110 may include the pulse generator 131 configured to generate various pulses used during write, read, erase and/or recovery operations. The recovery controller 132 may be used to control the execution and timing of the recovery operation.

For example, the timing determinations related to when and how to perform a recovery operation made by the recovery controller 132 may be made in relation to at least one externally provided command and address. In certain approaches, a determination as to recovery operation timing may be made by the recovery controller 132 in relation to certain read data (Dout) retrieved from the target memory cells. Referring to FIG. 2, read data (DATA) may be provided from the column decoder 150 to the write/read circuit 120 and subsequently provided to an external circuit under the control of the logic circuit 130. Alternately, write data (DATA) may be received in the write/read circuit 120 from an external circuit before being programmed to the memory cell array 110 under the control of the logic circuit 130.

As noted above, the control logic 130 may be used to detect a write cycle and thus may be used to determine whether or not to perform a recovery operation. For example, the recovery controller 132 may determine whether an externally-received command is a write command requesting that associated write data be programmed to the memory cell array 110. In certain embodiments, each received write command will increment a write cycle value counted by the control logic 130. The recovery controller 132 may compare a current write cycle value with a reference value in order to determine whether or not to perform the recovery operation. For example, the recovery controller 132 may cause execution of the recovery operation when the write cycle value reaches the reference value.

In making the determination as to whether or not a recovery operation should be performed in relation to a received write command, a corresponding address may be further considered by the control logic 130. For example, assuming that the memory cell array 110 includes a number of designated memory cell regions, the determination regarding execution of the recovery operation may be made in relation to the particular memory cell region indicated by the received address. That is, the recovery controller 132 may check at least one address bit of the address, and a memory cell region including a memory cell to which the write data is to be written may be detected. In this regard, separate write cycle values may be maintained for each one of the designated memory cell regions, and whenever a write cycle with respect to a particular memory cell region reaches its reference value, the recovery operation may be performed in relation to that memory cell region.

Hence, by checking at least one address bit value in a row address (X_ADDR) portion of an address (ADDR), and at least one address bit value of a column address (Y_ADDR) portion of the address, it is possible to determine which memory cell region includes at least one target memory cell to which the received write data will be written. Alternatively, a target memory cell region may be detected by checking only the at least one bit address bit value of the row address (X_ADDR) or the column address (Y_ADDR). For example, when the memory cell array 110 includes a plurality of pages and each page includes a plurality of memory cells commonly connected to a single word line, a recovery operation may be performed according to page units by checking only an address bit value in the row address (X_ADDR) portion.

In other embodiments of the inventive concept, all of the address bit values in both the row address (X_ADDR) and column address (Y_ADDR) portions of an address will be checked when a recovery operation is to be performed in a unit of singularly designated memory cells.

The control logic 130 may be used to perform error detection (with or without correction) on read data (Dout) retrieved during a read operation or a write verification operation. As part of this process, a determination may be made as to whether a recovery operation should be performed on target memory cells providing the read data. For example, a read operation may be performed on the memory cell array 110 in response to an externally provided read command, and the corresponding read data may be provided to the recovery controller 132. A unit capable of detecting error(s) in the retrieved read data may be internally or externally disposed in relation to the recovery controller 132. When an error detector (not shown) is arranged in the recovery controller 132, a number of errors (or a number of reset fail bits) occurring in the read data is counted, and the resulting count value may be compared with a reference value. As a result of this comparison, when the number of detected errors (or the number of detected reset fail bits) reaches or exceeds the reference value, the recovery operation will be performed on the target memory cells providing the read data.

In still other embodiments, a series of read operations may be performed on the memory cell array 110, a past error detection result with respect to read data obtained via a previously executed read operation (e.g., a first read operation) may be compared with a current error detection result with respect to the read data obtained via a currently executed read operation (e.g., a second read operation). When the control logic 130 determines that a difference between a number of errors occurring during the second read operation and a number of errors occurring during the first read operation exceeds than a reference value, the control logic 130 will cause the recovery operation to be executed in relation to the memory cells subjected to the first and second read operations.

In another embodiment, the error detection operation with respect to read data may be performed according to memory cell regions (or in relation to memory cell region units). For example, when each of the memory cell regions include memory cells of error detection and correction units, if a number of errors exceeding a reference value occurs in read data, the recovery operation may be performed on all memory cells of the corresponding memory cell region(s). Also, when the error detection result in the first read operation and the error detection result in the second read operation are compared with each other, the error detection results in the first and second read operations are compared with each other with respect to an equal memory cell region, and according to a result of the comparison, the recovery operation may be performed on the memory cell region.

According to the certain embodiments of the inventive concept, the control logic 130 may be used to control execution of the recovery operation according to a predetermined write cycle period, or in response to an error detection result with respect to the read data. Thus, a counted write cycle value and/or an error detection result may be used to trigger execution of the recovery operation by the control logic 130. Accordingly, since the corresponding application of a recovery pulse is rationally determined by one or more of the foregoing conditions (e.g., a counted write cycle value or a number of detected reset fail bits), it is possible to prevent undue memory cell fatigue that might otherwise arise if the relatively high level recovery pulse were too frequently applied. Further in certain embodiments of the inventive concept, since a number of reset fail bits is counted, any rapid or abnormal wearing of the resistive memory cells may be detected and mitigated by application of the recovery operation.

Figure 3:
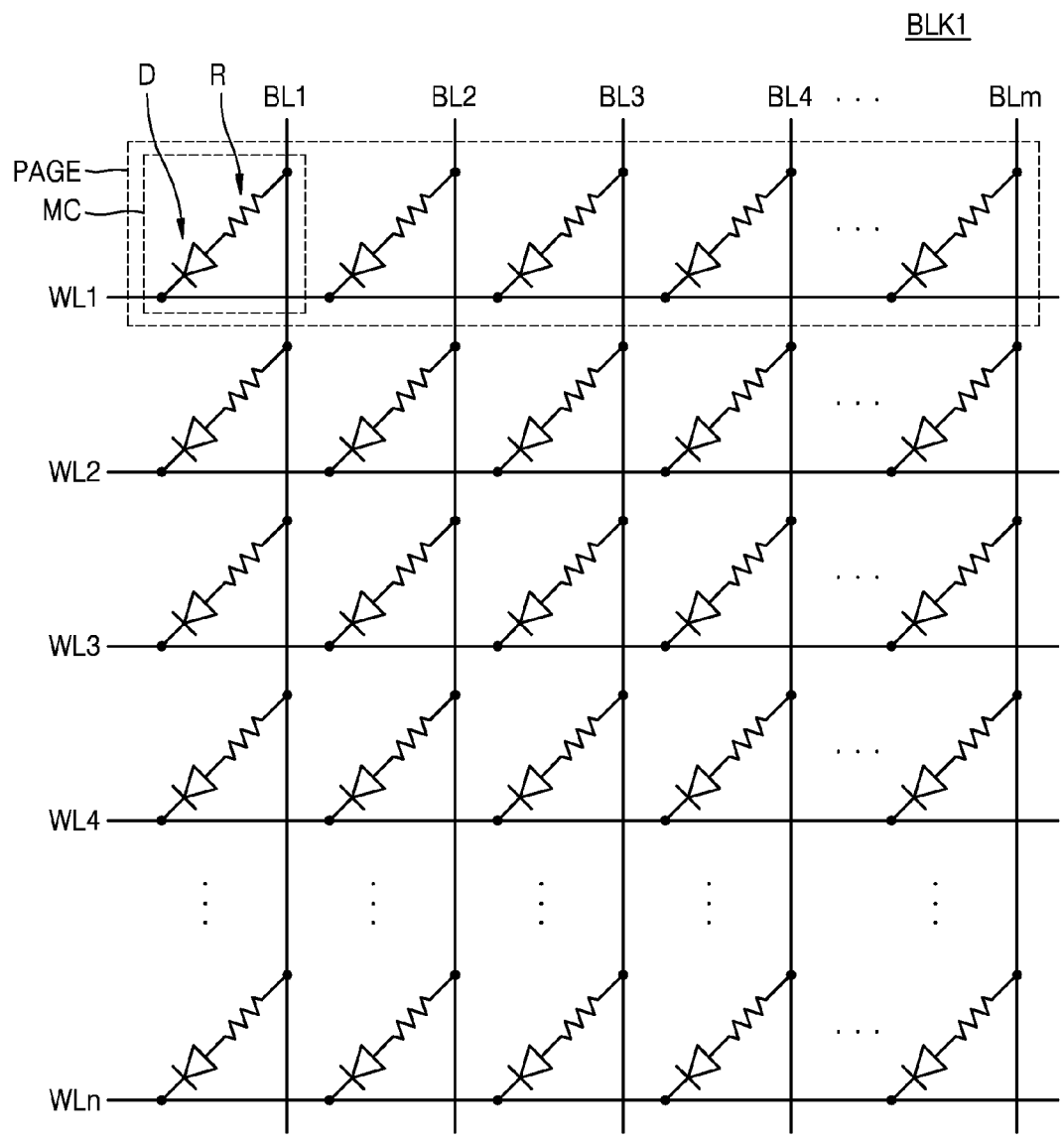
FIG. 3 is a circuit diagram illustrating an example of a memory cell array of FIG. 2.

FIG. 3 is a circuit diagram illustrating in one example the memory cell array 110 of FIG. 2. Here, it is assumed that the memory cell array 110 includes a plurality of memory blocks and FIG. 3 shows a portion of one memory block (BLK1).

Referring to FIG. 3, the memory block (BLK1) include resistive memory cells arranged in a horizontal structure. Here, other memory blocks may be similarly embodied as the memory block (BLK1) shown in FIG. 3, which includes a plurality of word lines WL1 through WLn, a plurality of bit lines BL1 through BLm and a plurality of memory cells MC. Here, the number of the word lines WL, the number of the bit lines BL, and the number of the memory cells MC will vary according to embodiment. Also, the memory cells MC selected by one word line may be defined as a page unit (PAGE).

In the illustrated embodiment of FIG. 3, each of the memory cells MC includes a variable resistor device R and a selection device D. Here, the variable resistor device R may be referred to as a variable resistor material, and the selection device D may be referred to as a switching device. The variable resistor device R is connected between a bit line and a selection device D, where the selection device D is connected between the variable resistor device R and a word line. However, one or more embodiments of the inventive concept are not limited thereto, and the selection device D may be connected between a bit line and the variable resistor device R, and the variable resistor device R may be connected between the selection device D and a word line.

The variable resistor device R may be switched to one of a plurality of resistive states in response to an applied electrical pulse. The variable resistor device R may include a phase-change material whose crystal state is changed according to a current. The phase-change material may include various materials GaSb, InSb, InSe, or Sb2Te3 obtained by compounding two elements, GeSbTe, GaSeTe, InSbTe, SnSb2Te4, or InSbGe obtained by compounding three elements, or AgInSbTe, (GeSn)SbTe, GeSb(SeTe), Te81Ge15Sb2S2 obtained by compounding four elements.

The phase-change material may have an amorphous state having a relatively high resistance, and a crystalline state having a relatively low resistance. The phase of the phase-change material may be changed by a Joule's heating effect generated by application of the current. Using the change of the phase, data may be coherently written to the resistive memory cell.

Alternately, the variable resistor device R may substitute the phase-change material for a perovskite compounds, transition metal oxide, magnetic materials, ferromagnetic materials, or antiferromagnetic materials.

Since the selection device D is connected between a word line and the variable resistor device R, a control voltage applied to the word line and/or bit line will generate a current passing through or a voltage applied across the variable resistor device R in a controlled manner. For example, the selection device D may be a PN-junction diode or a PIN-junction diode, and an anode of a diode may be connected to the variable resistor device R, and a cathode of the diode may be connected to the word line. Here, when a voltage difference between the anode and the cathode of the diode is greater than a threshold voltage of the diode, the diode is turned ON so that the current may be supplied to the variable resistor device R.

Figure 4A:
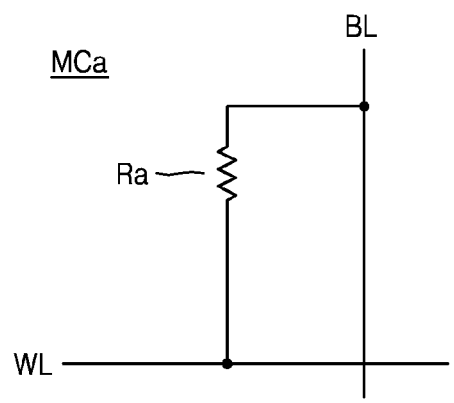
FIGS. 4A, 4B and 4C are circuit diagrams of modified examples of a memory cell of FIG. 3.
Figure 4B:
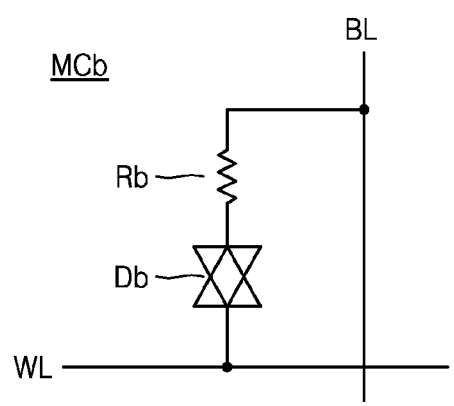
Figure 4C:
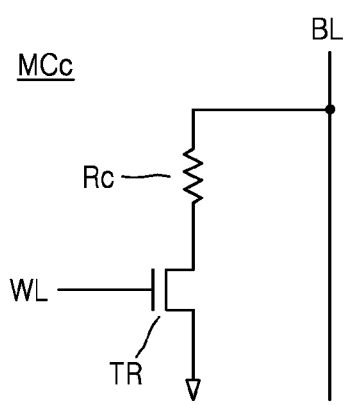

FIGS. 4A, 4B and 4C are respective circuit diagrams illustrating some possible modifications to the memory cell MC example of FIG. 3.

Referring to FIG. 4A, a memory cell MCa may include a variable resistor device Ra that may be connected between a bit line BL and a word line WL. The memory cell MCa may store data due to voltages that are applied to the bit line BL and the word line WL, respectively.

Referring to FIG. 4B, a memory cell MCb may include a variable resistor device Rb and a bidirectional diode Db. The variable resistor device Rb may include a resistive material so as to store data. The bidirectional diode Db may be connected between the variable resistor device Rb and a word line WL, and the variable resistor device Rb may be connected between a bit line BL and the bidirectional diode Db. Positions of the bidirectional diode Db and the variable resistor device Rb may be changed with respect to each other. By using the bidirectional diode Db, a leakage current that may flow a non-selected resistor cell may be cut.

Referring to FIG. 4C, a memory cell MCc may include a variable resistor device Rc and a transistor TR. The transistor TR may be a selection device, i.e., a switching device that supplies or cuts a current to the variable resistor device Rc, according to a voltage of a word line WL. The transistor TR may be connected between the variable resistor device Rc and the word line WL, and the variable resistor device R may be connected between a bit line BL and the transistor TR. Positions of the transistor TR and the variable resistor device Rc may be changed with respect to each other. The memory cell MCc may or may not be selected according to the ON/OFF state of the transistor TR as driven by the word line WL.

Figure 5:
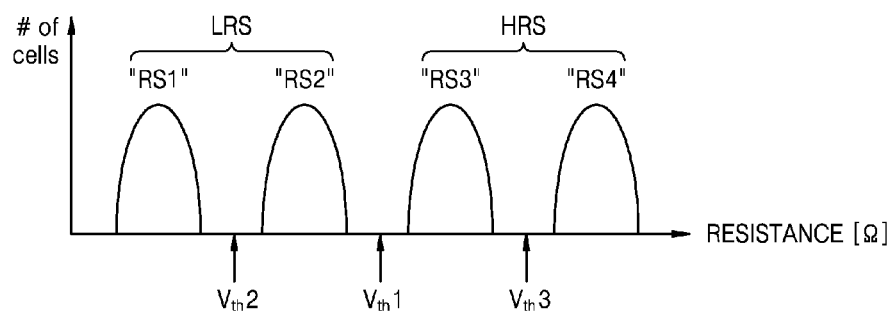
FIG. 5 is a graph illustrating a distribution of resistance levels of a memory cell of FIG. 3.

FIG. 5 is a conceptual graph illustrating possible resistive distributions that may be used in the programming and reading of the memory cell MC of FIG. 3. FIG. 5 assumes that the memory cell MC is a 2-bit MLC.

Referring to FIG. 5, the horizontal axis indicates a resistance level, and the vertical axis indicates a number of memory cells MC, where a resistance value for the memory cell MC may have one of a first resistance state RS1, a second resistance state RS2, a third resistance state RS3, and a fourth resistance state RS4. A first threshold resistance level Vth1 separates the second resistance state RS2 and third resistance state RS3. Here, the first resistance state RS1 and second resistance state RS2 will be equal to or less than the first threshold resistance level Vth1 and indicate a low resistance state LRS. The third resistance state RS3 and fourth resistance state RS4 will be greater than the first threshold resistance level Vth1 indicate a high resistance state HRS. Also, a second threshold resistance level Vth2 separates the first resistance state RS1 and second resistance state RS2, and a third threshold resistance level Vth3 separates the third resistance state RS3 and fourth resistance state RS4. Hence the first, second and third threshold resistance levels Vth1, Vth2 and Vth3 may be used to discriminate between the four (4) resistance states RS1, RS2, RS3 and RS4.

Each of the first, second, third, and fourth resistance states RS1, RS2, RS3, and RS4 corresponds to one of a data value '00', data value '01', data value '10', and data value '11'. In the illustrated embodiment of FIG. 5, the resistance level of a target memory cell increases in order of the data '11', the data '01', the data '00', and the data '10'. That is, the first resistance state RS1 corresponds to the data '11', the second resistance state RS2 corresponds to the data '01', the third resistance state RS3 corresponds to the data '00', and the fourth resistance state RS4 corresponds to the data '10'.

Figure 6:
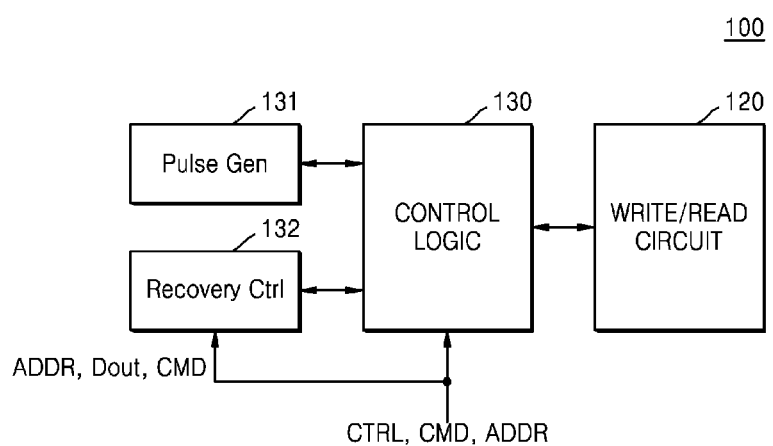
FIG. 6 is a block diagram of the memory device of FIG. 2 according to another embodiment of the inventive concept.

FIG. 6 is a block diagram further illustrating in another example the memory device 100 of FIG. 2. As shown in FIG. 6, one of the pulse generator 131 and the recovery controller 132 may be externally disposed with respect to the control logic 130. The pulse generator 131 may be used to generate and provide one or more pulses for write, read, and recovery operations to the control logic 130. The control logic 130 may control the pulse generator 131 to generate the pulses that correspond to the write, read, and recovery operations, respectively. Also, the control logic 130 may provide the received pulses to the write/read circuit 120.

In response to various types of information, the recovery controller 132 may be used to determine whether to perform the recovery operation. As described above, the recovery controller 132 may receive at least one of a command (CMD), an address (ADDR), and/or read/write data (Dout), and then determine whether to perform the recovery operation on target memory cells according to determination criteria.

Figure 7A:
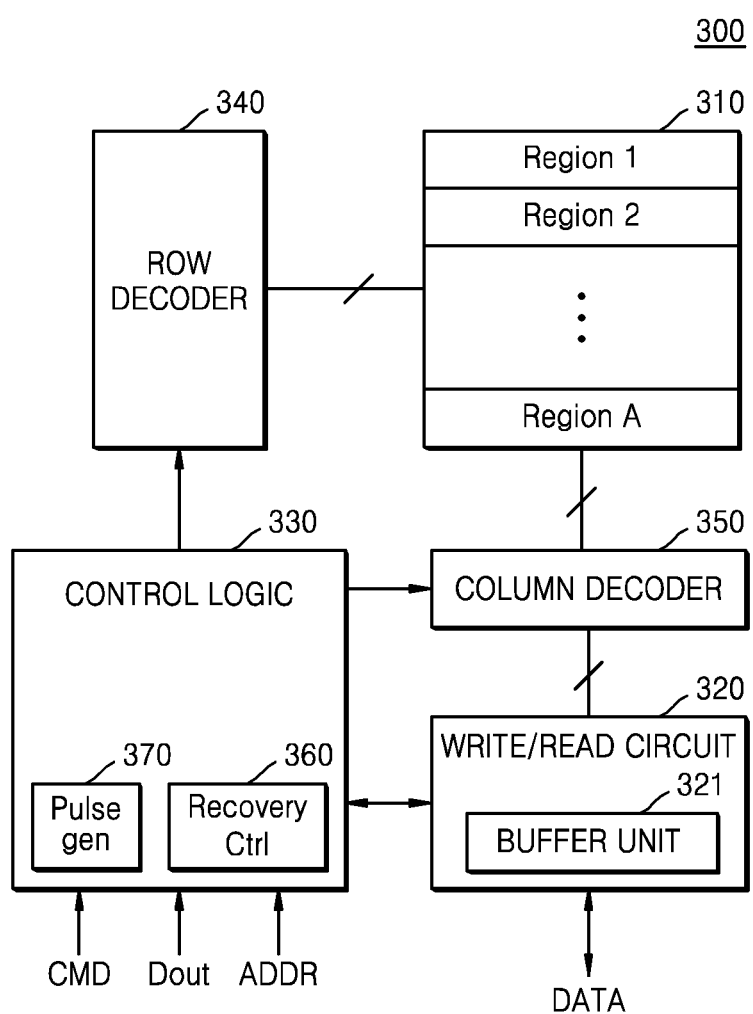
FIGS. 7A and 7B are block diagrams of a memory device according to another embodiment of the inventive concept.
Figure 7B:
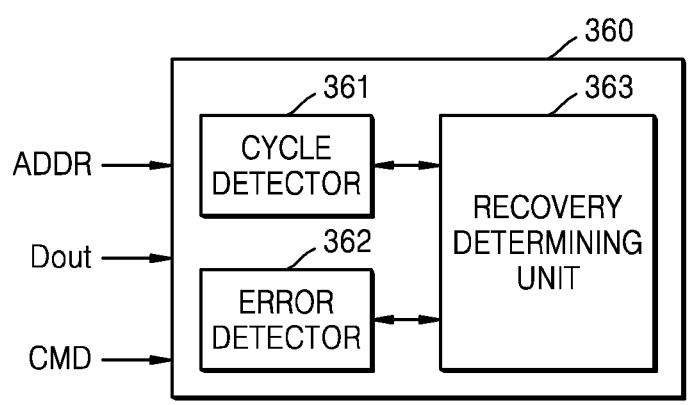

FIGS. 7B and 7B are block diagrams illustrating in one example a memory device 300 according to certain embodiments of the inventive concept. With respect to the structure and operation of the memory device 300 shown in FIGS. 7B and 7B, respective elements of the memory device 300 that are similar to those of the memory device 100 shown in FIG. 2 will not again be described in detail.

As illustrated in FIG. 7A, the memory device 300 comprises a memory cell array 310, a write/read circuit 320, and a control logic 330. The memory device 300 includes a row decoder 340 and a column decoder 350, and the write/read circuit 320 includes a buffer unit 321 that may be used to temporarily store incoming write data and outgoing read data (DATA). The control logic 330 includes a pulse generator 370 and a recovery controller 360, and as described above, at least one of the pulse generator 370 and the recovery controller 360 may be arranged external to the control logic 330. The memory cell array 310 includes a designated plurality of memory cell regions (Region 1 through Region A).

As described above, the control logic 330 may be used to control execution of a recovery operation according to a counted write cycle value and/or a detected number of reset fail bits. In order to determine whether to perform the recovery operation, the control logic 330 may detect whether a received command (CMD) is a write command, and may further check the corresponding address (ADDR) in order to detect a particular memory cell region to which the write operation is directed.

Alternately or additionally, an error detection operation may be performed with respect to read data (Dout) retrieved from the memory cell array 310.

In the illustrated embodiment of FIG. 7A, when the recovery operation is performed on a second memory cell region (Region 2), data stored in the second cell region will be read using a read operation such that the read data is temporarily stored in the buffer unit 321. The pulse generator 370 generates a recovery pulse associated with the recovery operation, and provides the recovery pulse to the write/read circuit 320. When a pulse current (or pulse voltage) corresponding to the recovery pulse is provided to memory cells of the second cell region via bit lines, the recovery operation is performed on the memory cells. After the pulse current (or pulse voltage) is provided to the memory cells of the second cell region, a write operation is performed on the memory cells of the second cell region consistent with the read that was temporarily stored in the buffer unit 321, such that the original data is again stored in the memory cells of the second cell region.

FIG. 7B is a block diagram illustrating in one example the recovery controller 360 of FIG. 7A. The recovery controller 360 includes a cycle detector 361, an error detector 362, and a recovery determining unit 363.

The cycle detector 361 detects a write cycle (or counts a write cycle value) in relation to an externally-provided command and/or corresponding address. The cycle detector 361 may internally include a counter (not shown), and may perform a counting operation in response to a received write command. As described above, when a recovery operation is performed at a predetermined period in the write cycle, the cycle detector 361 may detect whether a received command is a write command. Also, when the recovery operation is performed on a memory cell region basis, the cycle detector 361 may check at least one bit of the address and thus may detect the memory cell region requiring the recovery operation.

The error detector 362 may be used to perform an error detection operation on the read data (Dout), and detect a number of errors (e.g., a number of reset fail bits). Also, the error detector 362 may perform a comparison operation so as to determine whether the number of detected errors is greater than a preset reference value. The recovery determining unit 363 may receive the detection result and/or the comparison result from the cycle detector 361 and the error detector 362, may finally determine whether to perform the recovery operation on the memory cell array 310, and thus may generate a determination result. The control logic 330 may control the recovery operation to be performed based on the determination result.

Figure 8:
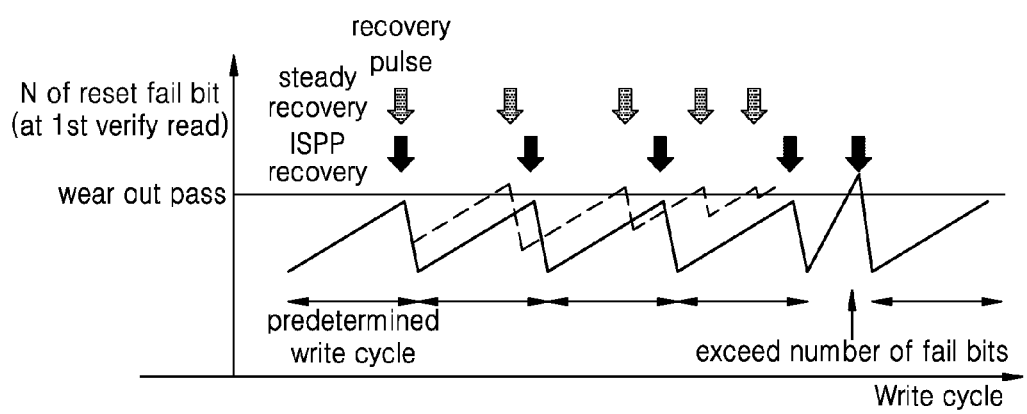
FIG. 8 is a graph illustrating a timing at which a recovery operation is performed according to an embodiment of the inventive concept.

FIG. 8 is a graph illustrating exemplary timing of a recovery operation execution according to certain embodiments of the inventive concept. Referring to FIG. 8, the horizontal axis indicates a write cycle, and the vertical axis indicates a number of reset fail bits occurring in read data. In order to verify a write operation, a read operation may be iteratively performed, and FIG. 8 illustrates a number of reset fail bits occurring in the read operation according to first verification.

As illustrated in FIG. 8, as the write cycle increases, the number of reset fail bits also increases. Since a recovery pulse is applied at a predetermined period of the write cycle, the number of reset fail bit may be decreased in a next write operation. That is, it is possible to prevent memory cell wear out from reaching an unacceptable state.

Also, when memory cell wear out rapidly occurs even before the write cycle reaches a reference value, the number of reset fail bits detected may be greater than a reference value. According, since execution of the recovery operation may be triggered by a detecting number of reset fail bits and not just a predetermined period for a write cycle, badly worn memory cells may be recovered by the recovery operation even when the memory cells have become badly worn quite rapidly.

According to various embodiments of the inventive concept, whenever the recovery operation is performed, a width and/or level of the constituent recovery pulse may be intelligently determined. A case where the recovery operation is performed by varying the width and/or the level of the recovery pulse may be defined as an ISPP recovery, and a case where a recovery pulse having a constant width and level may be defined as a steady recovery. According to certain embodiments of the inventive concept, the ISPP recovery may be used so that a recovery performance period may be increased, compared to a steady recovery operation shown by the dashed line in FIG. 8. A detailed description of one possible ISPP recovery will be provided hereafter.

Figure 9:
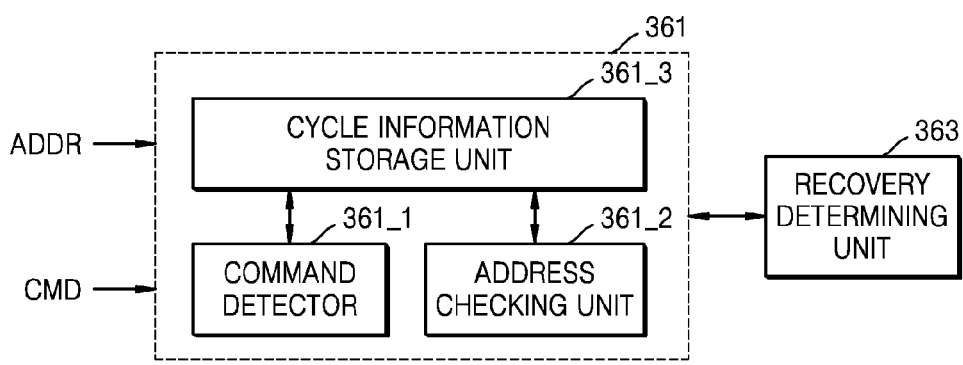
FIG. 9 is a block diagram of a cycle detector of FIG. 7B according to an embodiment of the inventive concept.

FIG. 9 is a block diagram illustrating in one example the cycle detector 361 of FIG. 7B. As shown in FIG. 9, the cycle detector 361 may include a command detector 361_1, an address checking unit 361_2, and a cycle information storage unit 361_3.

The command detector 361_1 performs a detection operation on a received command (CMD) in order to detect whether the command is a write command. According to the detection result, information related to a write cycle stored in the cycle information storage unit 361_3 is updated. Also, as described above, when the recovery operation is performed on a memory cell region basis, it will be necessary to detect the memory cell region requiring the recovery operation. Accordingly, the address checking unit 361_2 may check at least one bit of a received address (ADDR). When the write command is received, a memory cell region including the target memory cell(s) to which data is to be written may be checked, and information related to a write cycle for each of the memory cell regions may be stored in the cycle information storage unit 361_3. The recovery determining unit 363 may receive and analyze the information stored in the cycle information storage unit 361_3 and thus may determine whether to perform a recovery operation and to which cell region that the recovery operation is to be performed. Although it is described that, when the command is received, the information of the cycle information storage unit 361_3 is updated and the information is analyzed, but, in another embodiment, regardless of whether the command is received, whether to perform the recovery operation may be periodically determined according to the information stored in the cycle information storage unit 361_3.

Figure 10A:
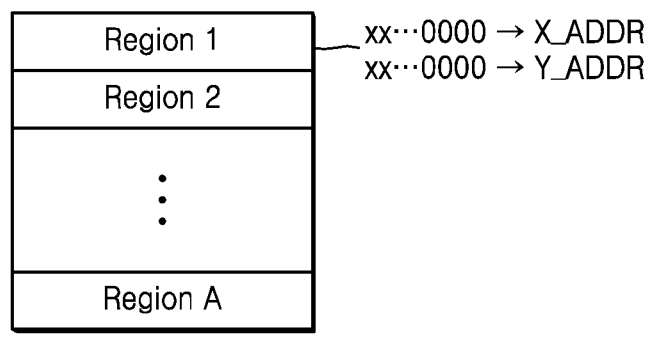
FIGS. 10A and 10B illustrate examples where a recovery operation is performed on each of cell regions according to embodiments of the inventive concept.
Figure 10B:
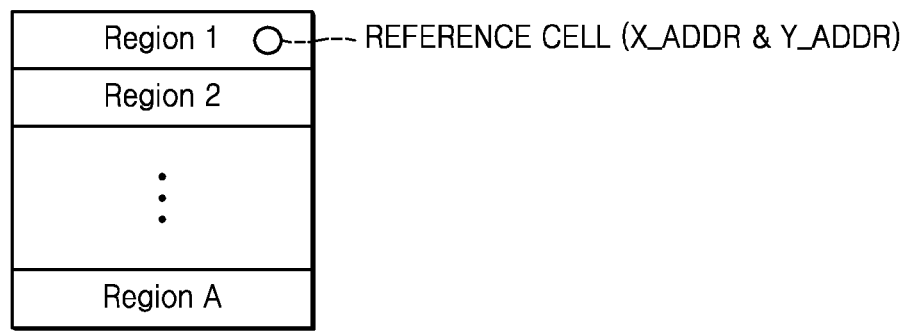

FIGS. 10A and 10B are respective conceptual diagrams illustrating examples where a recovery operation is performed on each of memory cell regions (Region 1 through Region A) according to embodiments of the inventive concept. In the example of FIG. 10A, a write cycle of each of the memory cell regions is detected by checking one or more bits of an address (ADDR). In the example of FIG. 10B, a reference cell is disposed in each of the memory cell regions (Region 1 through Region A), and a write cycle for the reference cell is detected by checking all bits of the address (ADDR).

Each of the memory cell regions (Region 1 through Region A) may be selected by one or more bits of the address (ADDR). For example, a particular memory cell region to which a currently-accessed (target) memory cell belongs may be detected using one or more address bits selected form a row address (X_ADDR) and/or one or more address bits selected from a column address (Y_ADDR). Thus, information related to a write cycle with respect to each of the memory cell regions may be counted and stored. For example, when a request for a write operation with respect to a memory cell that belongs to the second cell region (Region 2) is received, a write cycle for the second memory cell region may be increased. When the write cycle of the second memory cell region exceeds a reference value, a recovery operation will be performed on the second memory cell region.

As illustrated in FIG. 10B, when a reference cell is disposed in each of the cell regions (Region 1 through Region A), and an address (ADDR) that corresponds to the reference cell is received, a write cycle for the memory cell region including the reference cell is increased. Accordingly, whenever a write operation with respect to a reference cell included in a particular cell region is performed by a predetermined number of times, a recovery operation may be performed on the particular memory cell region including the reference cell.

Figure 11:
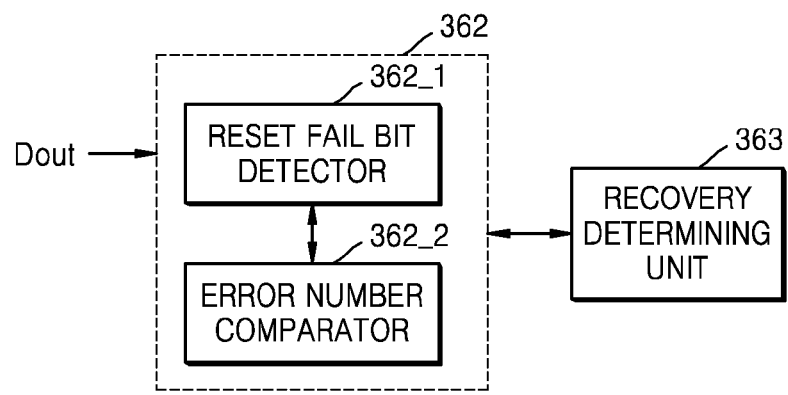
FIG. 11 is a block diagram of an error detector of FIG. 7B according to an embodiment of the inventive concept.

FIG. 11 is a block diagram further illustrating in one example the error detector 362 of FIG. 7B. As illustrated in FIG. 11, the error detector 362 comprises a reset fail bit detector 362_1 and an error number comparator 362_2.

The reset fail bit detector 362_1 may be used to perform a detection operation on a reset fail bit occurring in read data (Dout). For example, a reset fail bit occurs when a variable resistor included in a memory cell is not varied from a low resistance state (e.g., data 0) to a high resistance state (e.g., data 1), and the reset fail bit detector 362_1 may check data that is read from the memory cell to which the data 1 is to be written, and thus may detect whether the reset fail bit occurred in the memory cell. Information about the number of reset fail bits detected in read data associated with a predetermined error detection unit may be provided to the error number comparator 362_2, and then the error number comparator 362_2 may compare the number of reset fail bits with a reference value to generate a comparison result. In response to the comparison result, the recovery determining unit 363 may determine whether to perform the recovery operation.

Figure 12:
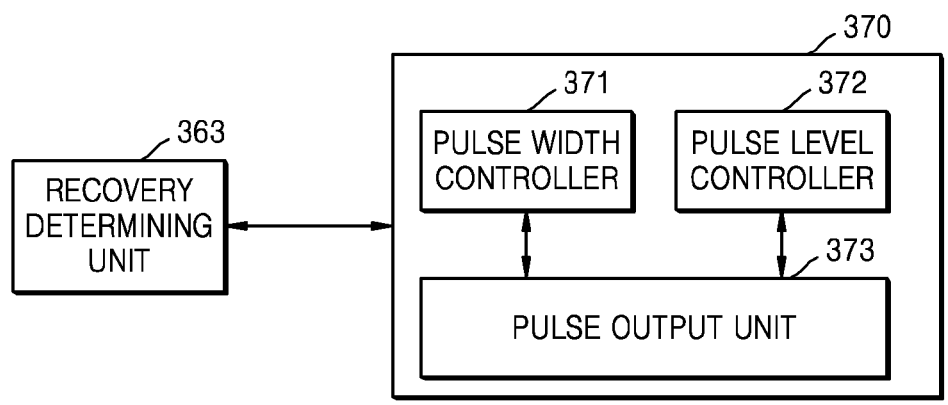
FIG. 12 is a block diagram of a pulse generator of FIG. 7A, according to an embodiment of the inventive concept

FIG. 12 is a block diagram further illustrating in one example the pulse generator 370 of FIG. 7A. As illustrated in FIG. 12, the pulse generator 370 comprises a pulse width controller 371, a pulse level controller 372, and a pulse output unit 373.

As described above, whenever the recovery operation is performed, the width and/or level of the recovery pulse may be varied. Each of the pulse width controller 371 and the pulse level controller 372 may internally store information about a recovery cycle, and thus, whenever the recovery operation is performed, the pulse width controller 371 and the pulse level controller 372 may output control information for varying the width and/or the level of the recovery pulse. The pulse output unit 373 may generate a recovery pulse with the adjusted width and/or level, based on the control information from the pulse width controller 371 and the pulse level controller 372.

Figure 13:
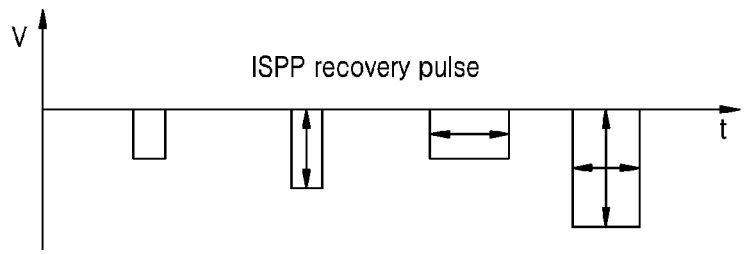
FIG. 13 is a graph illustrating a recovery pulse used in an ISSP recovery according to an embodiment of the inventive concept.

FIG. 13 is a graph illustrating variation of a recovery pulse that may be used in an ISSP recovery according to certain embodiments of the inventive concept. Whenever a recovery operation is performed, the width and/or level of a recovery pulse may be controlled, and as illustrated in FIG. 13, when a particular recovery operation is performed, a recovery pulse with a varied width may be generated, or when another particular recovery operation is performed, a recovery pulse with a varied level may be generated. Alternatively, when other particular recovery operation is performed, a recovery pulse with a varied width and level may be generated.

According to the embodiments illustrated in FIGS. 12 and 13, for example, a performance period for the recovery operation may be increased as illustrated in FIG. 8. Referring back to FIG. 8, when a steady recovery manner as shown with a dotted line is used as a recovery cycle proceeds, the number of memory cells that are recovered may be decreased, so that a period of applying a recovery pulse may be decreased. On the other hand, when an ISPP recovery is applied, although a recovery cycle proceeds, the number of actually recovered memory cells may be constantly maintained. Accordingly, a period of a recovery operation may be increased (or, the number of times a recovery operation is performed may be decreased), so that a performance of a write operation may be improved, and power consumption may be decreased.

Figure 14:
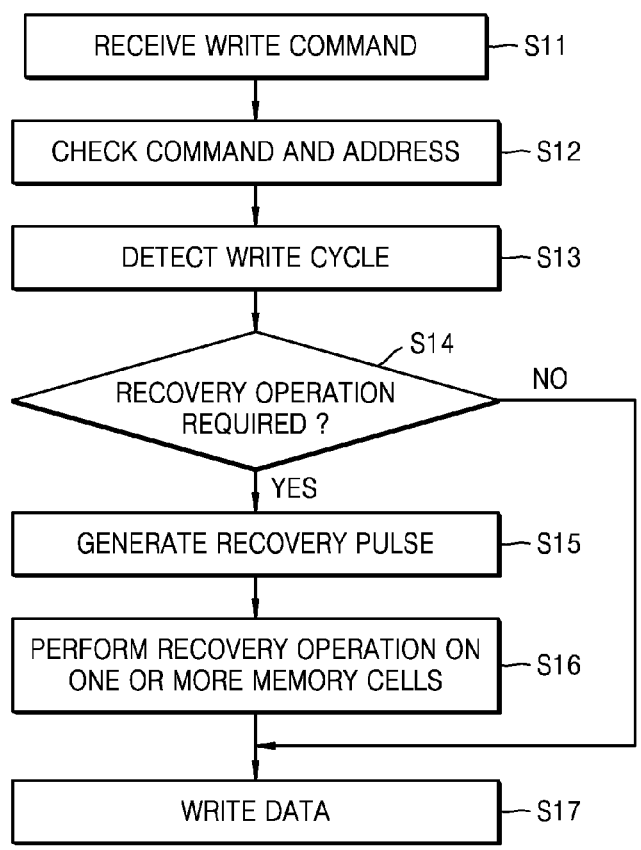
FIG. 14 is a flowchart of an operating method of a memory device according to an embodiment of the inventive concept.

FIG. 14 is a flowchart summarizing an operating method for a memory device according to embodiments of the inventive concept.

In response to a data access request received from a host, a memory controller generates one or more corresponding command(s). For example, in response to a data write request, the memory controller may generate and provide a write command to the memory device. The memory device may receive the write command (S11), and may determine whether the received command is a write command by performing a command check operation. Also, the memory device may receive a write address associated with the write command and check the received write address in order to determine a memory cell region including the target memory cell (S12).

According to a result of checking the write command and write address, a write cycle is detected (S13). As described above, the write cycle may indicate a write cycle of an entire memory cell array or a write cycle of each of cell regions in the memory cell array. According to a result of detecting the write cycle, whether it is required to perform a recovery operation may be determined (S14).

As a result of the determination, if it is required to perform the recovery operation, a recovery pulse is generated (S15), and since the recovery pulse is provided to the memory cell array, the recovery operation is performed on one or more memory cells of the memory cell array (S16). After the recovery operation on the one or more memory cells is completed, a data write operation associated with the write command is performed (S17). On the other hand, if it is not required to perform the recovery operation, data may be written, without the recovery operation.

Figure 15:
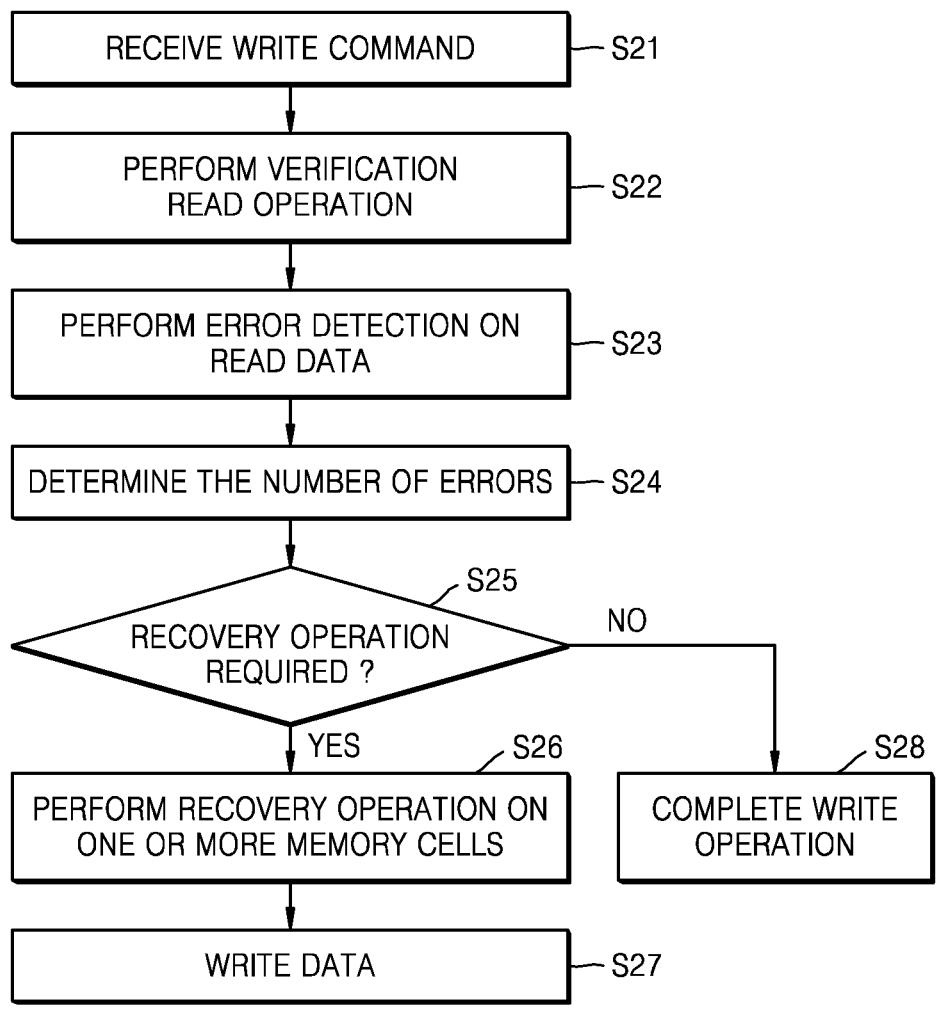
FIG. 15 is a flowchart of an operating method of a memory device according to another embodiment of the inventive concept.

FIG. 15 is a flowchart summarizing an operating method for a memory device according to other embodiments of the inventive concept.

The memory device receives a write command from a memory controller (S21), and performs a data write operation in response to the write command. In order to verify the writing of the write data, a verification read operation is performed (S22), and an error detection operation is performed on the resulting read data (S23). According to a result of the error detection operation, a number of errors in the read data is be determined (e.g., a number of reset fail bits) (S24).

According to the determination result with respect to the number of the errors, a recovery operation may be performed (S25). If the recovery operation is required, a recovery pulse is provided to a memory cell array, so that the recovery operation is performed on one or more memory cells of the memory cell array (S26). After the recovery operation with respect to the one or more memory cells is completed, the data write operation may again be performed (S27). On the other hand, when the number of the errors in the read data is equal to or less than a reference value, the data write operation may be completed without a separate recovery operation.

In the illustrated embodiment of FIG. 15, a determination as to whether or not a recovery operation should be performed is made in the context of a verification read operation. However, the scope of the inventive concept are not limited thereto, and for example, as described above, read data may be retrieved in response to a read command, and a determination of whether or not to perform a recovery operation may be made in relation to an error detection operation executed in relation to the read data.

Also, in the embodiments of FIGS. 14 and 15, whether to perform the recovery operation is determined by using a result of detecting the write cycle or by using a result of the error detection operation. However, as described above, whether to perform the recovery operation may be determined by using both the result of detecting the write cycle and the result of the error detection operation.

Figure 16:
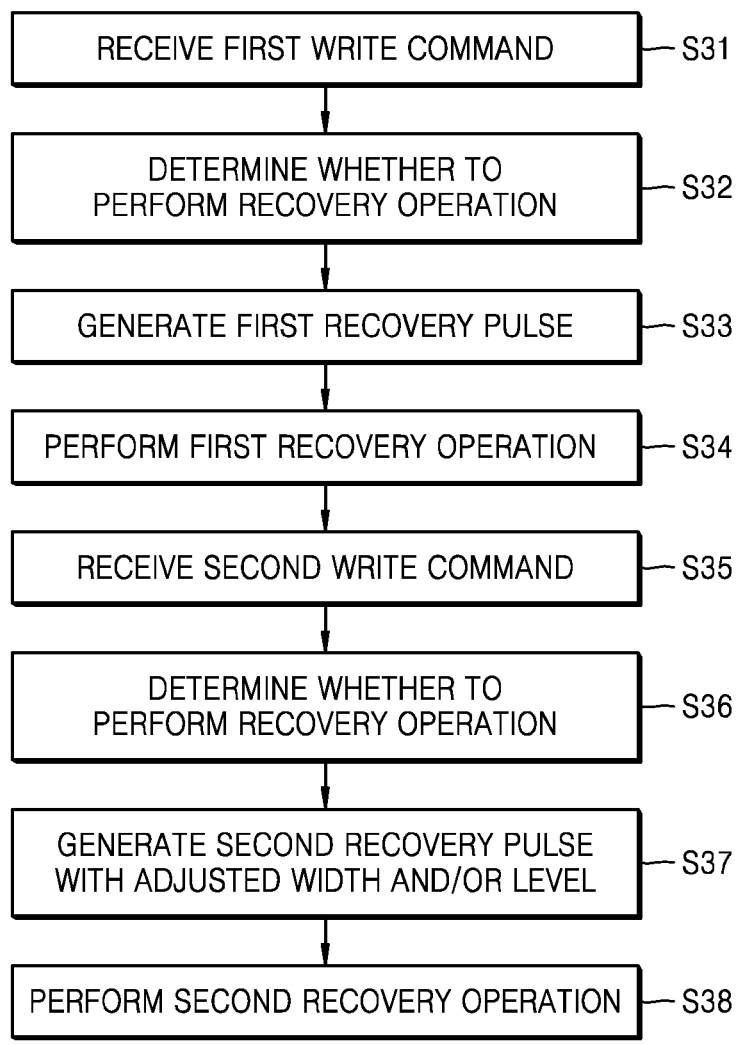
FIG. 16 is a flowchart of an operating method of a memory device according to another embodiment of the inventive concept.

FIG. 16 is a flowchart summarizing an operating method for a memory device according to still other embodiments of the inventive concept.

The memory device receives a first write command (S31), and determines whether to perform a recovery operation by applying one of the aforementioned embodiments in response to the first write command (S32). According to a result of detecting a write cycle and/or a result of an error detection operation with respect to read data, recovery operations may be sequentially performed, e.g., it is assumed that a recovery operation that is performed after a first recovery operation is performed may be referred as a second recovery operation.

As a first recovery pulse is generated (S33), the first recovery operation is performed (S34). Also, a next second write command is received (S35), whether to perform a recovery operation is determined (S36), and according to the determination result, a second recovery pulse is generated for the second recovery operation (S37). The second recovery pulse may have a width or a level that is different from a width or a level of the first recovery pulse. Alternatively, the second recovery pulse may have a width and a level that are all different from a width and a level of the first recovery pulse. According to the second recovery pulse, the second recovery operation may be performed (S38).

Figure 17:
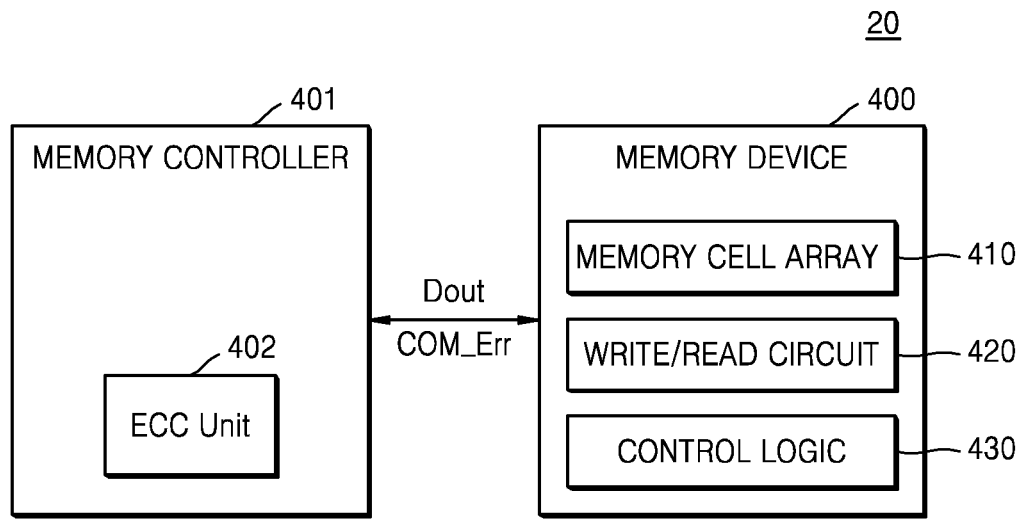
FIG. 17 is a block diagram of a memory system and a memory device according to another embodiment of the inventive concept.

FIG. 17 is a block diagram of a memory system 20 and a memory device 400, according to another embodiment of the inventive concept.

As illustrated in FIG. 17, the memory system 20 generally comprises a memory device 400 and a memory controller 401. The memory device 400 includes a memory cell array 410, a write/read circuit 420, and a control logic 430. A memory controller 401 may include an error correction circuit unit (ECC unit) 402. Although not illustrated in FIG. 17, the control logic 430 may include a unit (e.g., a recovery controller) for determining whether to perform a recovery operation, and in another embodiment, the recovery controller may be arranged outside the control logic 430. Similar to the previous embodiments, the control logic 430 may perform a recovery operation according to a result of detecting a write cycle, or may perform the recovery operation according to the number of errors occurred in read data (Dout).

In determining whether to perform the recovery operation according to the number of errors that occurred in the read data, the read data may be provided to the memory controller 401, and the ECC unit 402 may perform an error detection operation and an error correction operation on the read data. The ECC unit 402 performs the error detection operation on the read data Dout, and similar to the previous embodiments, the ECC unit 402 may provide an ECC comparison result (COM_Err) comparing the number of the errors with a predetermined reference value to the memory device 400. The control logic 430 may determine whether to perform the recovery operation, according to the ECC comparison result and may perform the recovery operation on one or more memory cells of the memory cell array 410 according to the determination.

According to the previous embodiments, the memory device 400 may detect a write cycle by checking a command from the memory controller 401 and thus may autonomously determine whether to perform the recovery operation. Also, the memory device 400 may receive the ECC comparison result with respect to the number of the errors detected by the memory controller 401, and may determine whether to perform the recovery operation in relation to the ECC comparison result.

Figure 18:
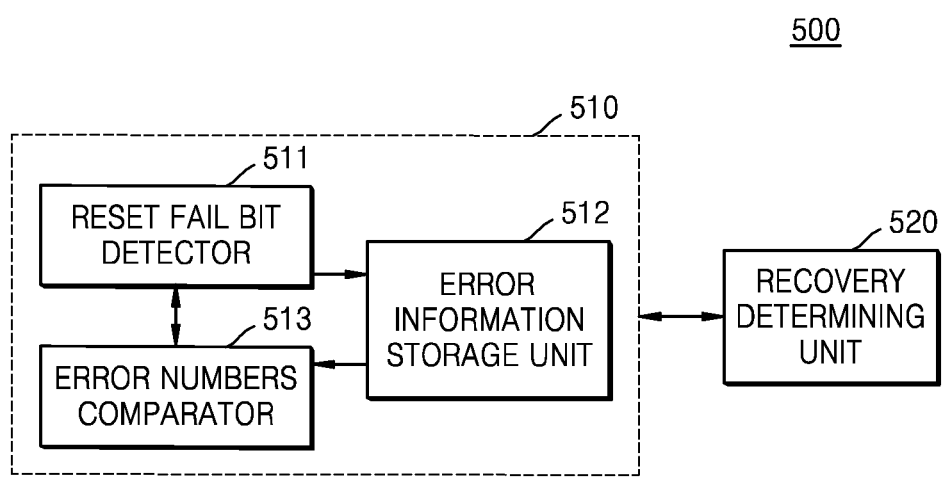
FIG. 18 is a block diagram of a memory device, according to another embodiment of the inventive concept.

As illustrated in FIG. 18, the memory device 500 may include a unit for determining whether to perform a recovery operation (e.g., the memory device 500 may include an error detector 510 and a recovery determining unit 520). Also, the error detector 510 may include a reset fail bit detector 511, an error information storage unit 512, and an error numbers comparator 513. Although not illustrated in FIG. 18, a cycle detector (not shown) for detecting a write cycle may be further arranged in the memory device 500. Also, functions of the error detector 510 and the recovery determining unit 520 may be arranged in a control logic or the error detector 510 and the recovery determining unit 520 may be arranged as function blocks separate from the control logic.

The reset fail bit detector 511 may perform a detection operation so as to detect a reset fail bit occurred in read data (Dout). For example, when data that is read from a memory cell requested to be written data with a value of 1 has a value of 0, the reset fail bit detector 511 may detect the memory cell as a memory cell with a reset fail bit. The error information storage unit 512 may store information according to a result of the error detection, e.g., information related to the number of reset fail bits that occurred in a plurality of pieces of data of a predetermined-size error detection and correction unit may be stored in the error information storage unit 512.

With respect to error detection operations that are sequentially performed, the number of reset fail bits occurred in data that is read via a first read operation may be compared with the number of reset fail bits occurred in data that is read via a second read operation after the first read operation. For example, a result of detecting the reset fail bits occurred in the data that is read via the second read operation may be provided to the error numbers comparator 513, and information about the number of reset fail bits occurred in the data that is read via the first read operation may be provided from the error information storage unit 512 to the error numbers comparator 513. The error numbers comparator 513 compares the number of the reset fail bits in the first and second read operations, and detects whether a difference thereof is greater than a predetermined reference value. According to the detection result, the recovery determining unit 520 may determine whether to perform a recovery operation.

According to the embodiment of FIG. 18, even when the number of reset fail bits occurred in a current read operation is not greater than a predetermined reference value, a recovery operation is performed based on determination with respect to whether occurrence of reset fail bits has been sharply increased in a previous read operation, thus, a recovery operation may be performed in advance before a wear out reaches a considerably bad state.

Figure 19A:
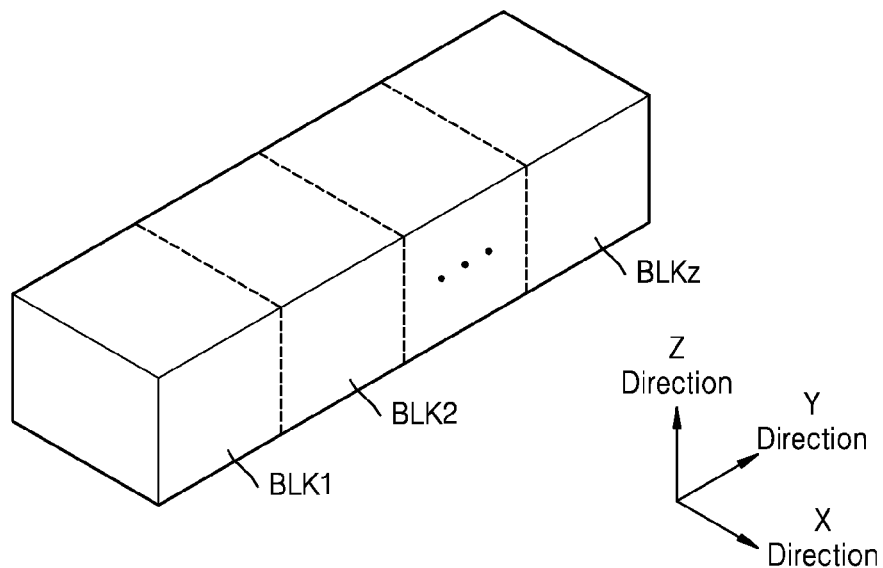
FIGS. 19A and 19B are a structure diagram and a circuit diagram, respectively, of the memory cell array of FIG. 1 according to an embodiment of the inventive concept.

FIG. 19A is a perspective diagram and 19B is a circuit diagram further illustrating in one example the memory cell array 110 of FIG. 1 according to certain embodiments of the inventive concept.

Figure 19B:
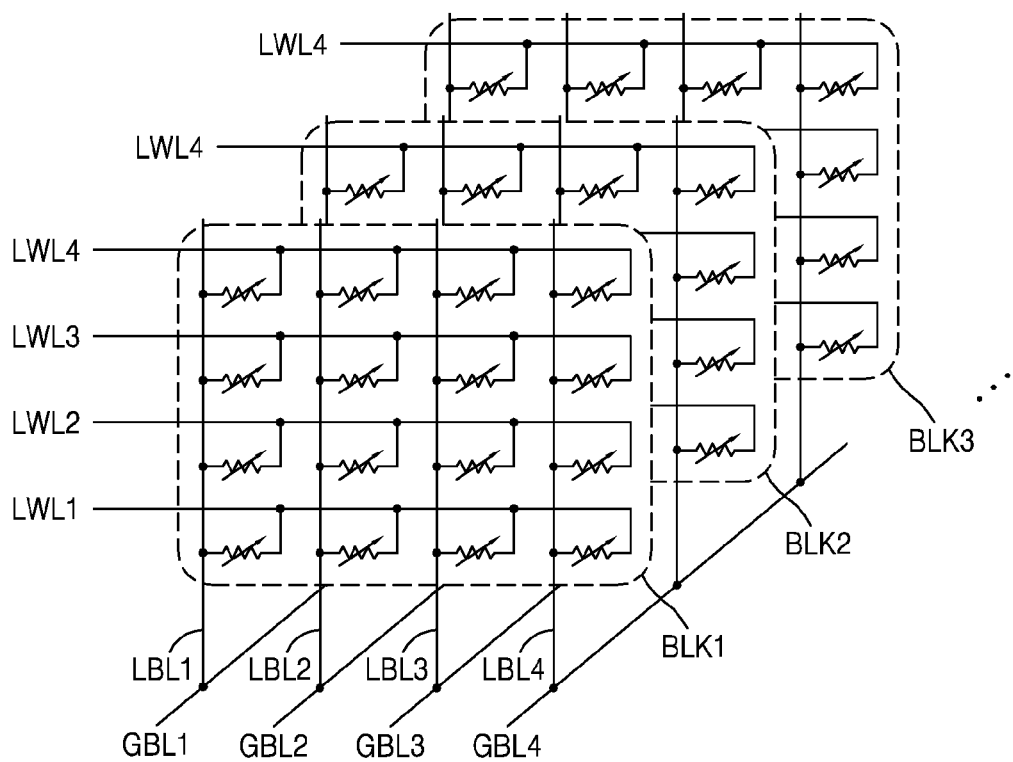

Referring to FIGS. 19A and 19B, the memory cell array 110 may include a plurality of memory blocks BLK1 through BLKz. Each of the memory blocks BLK1 through BLKz may have a three-dimensional structure (or a vertical structure). Also, each of the memory blocks BLK1 through BLKz may include a plurality of cell strings that extend in a direction perpendicular to a substrate.

Cell strings of one memory block may be connected to bit lines, string selection lines, and word lines. The cell strings of the memory blocks BLK1 through BLKz may share bit lines BL.

The memory blocks BLK1 through BLKz may be selected by the row decoder 140 and/or the column decoder 150 shown in FIG. 2. For example, the row decoder 140 may be configured to select a memory block among the memory blocks BLK1 through BLKz which is connected to a word line that corresponds to the row address X_ADDR. In the memory device 100, an erase operation may be performed by units of memory blocks, and in order to perform the erase operation on a memory block, a reset pulse may be applied to the memory block.

FIG. 19B illustrates an example where the memory blocks BLK1 through BLKz of FIG. 19A are embodied. For convenience of description, FIG. 19B does not illustrate a selection device that may be embodied as a diode or a transistor.

Referring to FIG. 19B, the memory cell array 110 may include the memory blocks BLK1 through BLKz that are three-dimensionally stacked. Also, the memory cell array 110 may include a plurality of local bit lines LBL1 through LBL4 that extend in parallel in a Z-axis direction, and a plurality of local word lines LWL1 through LWL4 that extend in parallel in an Y-axis direction that is perpendicular to the Z-axis direction. Also, the local bit lines LBL1 through LBL4 may be connected to global bit lines GBL1 through GBL4.

Referring to the first memory block BLK1, memory cells of the memory cell array 110 are connected between the local word lines LWL1 through LWL4 and the local bit lines LBL1 through LBL4. A write operation or a read operation may be performed on the memory cells by a current (or a voltage) that is applied to the local word lines LWL1 through LWL4 and/or the local bit lines LBL1 through LBL. For a recovery operation according to the one or more embodiments, a recovery current (or a recovery voltage) according to a recovery pulse may be applied to the local word lines LWL1 through LWL4 and/or the local bit lines LBL1 through LBL. A recovery performance unit may vary, e.g., the recovery operation may be performed on at least two memory blocks, one memory block, or a cell region unit in one memory block.

Figure 20:
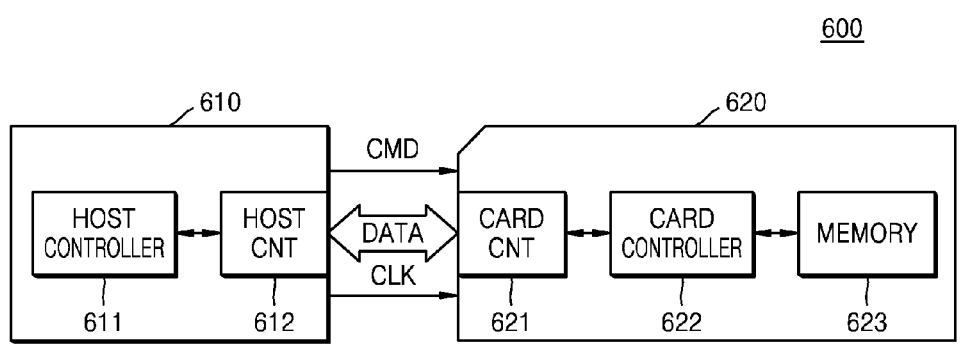
FIG. 20 is a block diagram of a memory card system having a resistive memory system applied thereto according to an embodiment of the inventive concept.

FIG. 20 is a block diagram illustrating a memory card system 600 incorporating a resistive memory system according to an embodiment of the inventive concept.

Referring to FIG. 20, the memory card system 600 may include a host 610 and a memory card 620. The host 610 may include a host controller 611 and a host connector 612. The memory card 620 may include a card connector 621, a card controller 622, and a memory device 623. Here, the memory card 620 may be embodied by using the embodiments shown in FIGS. 1 through 19, so that the memory card 620 may control whether to perform a recovery operation, based on a write cycle detection result and/or an error detection result.

The host 610 may write data to the memory card 620 or may read data stored in the memory card 620. The host controller 611 may transmit a command (CMD), a clock signal (CLK) generated by a clock generator (not shown) in the host 610, and data (DATA) to the memory card 620 via the host connector 612.

In response to the command received via the card connector 621, the card controller 622 may store the data in the memory device 623 in synchronization with a clock signal generated by a clock generator (not shown) in the card controller 622. The memory device 623 may store the data communicated from the host 610.

The memory card 620 may be embodied as a CFC, a micro-drive, an SMC, an MMC, a Security Digital Card (SDC), a memory stick, or a USB flash memory drive.

Figure 21:
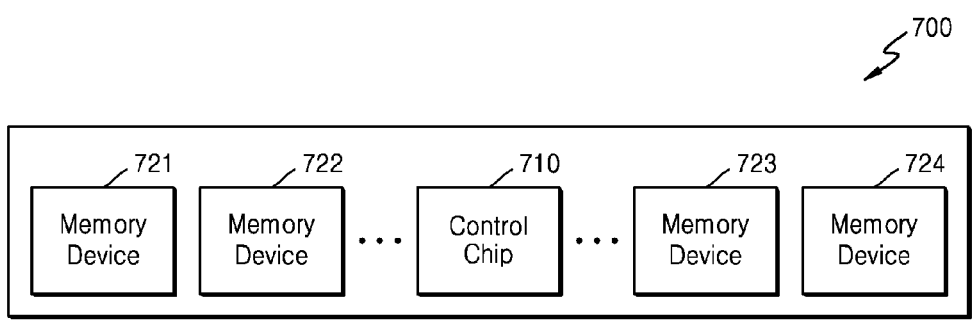
FIG. 21 illustrates a resistive memory module, according to an embodiment of the inventive concept.

FIG. 21 is a block diagram illustrating a resistive memory module 700 according to certain embodiments of the inventive concept. Referring to FIG. 21, the resistive memory module 700 includes memory devices 721 through 724, and a control chip 710. Each of the memory devices 721 through 724 may be embodied by using the embodiments shown in FIGS. 1 through 19. In response to various signals transmitted by an external memory controller, the control chip 710 may control the memory devices 721 through 724. For example, according to various commands and addresses that are transmitted from an external source, the control chip 710 may activate the memory devices 721 through 724 corresponding to the various commands and addresses and thus may control write and read operations. Also, the control chip 710 may perform various post processing operations on read data output from each of the memory devices 721 through 724, e.g., the control chip 710 may perform error detection and correction operations on the read data.

According to the present embodiment, the memory devices 721 through 724 may control whether to perform a recovery operation, based on a write cycle detection result and/or an error detection result. In another embodiment, the error detection operation may be performed in the control chip 710, and the error detection result may be provided to each of the memory devices 721 through 724. Each of the memory devices 721 through 724 may determine whether to perform the recovery operation by using the error detection result from the control chip 710.

Figure 22:
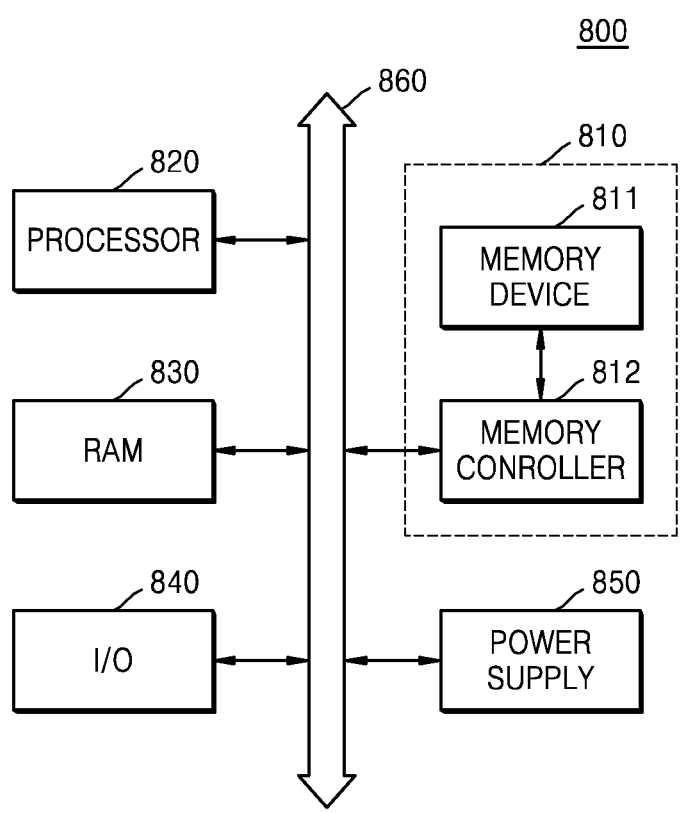
FIG. 22 is a block diagram of a computing system including a resistive memory system, according to an embodiment of the inventive concept.

FIG. 22 is a block diagram of a computing system 800 including a resistive memory system according to an embodiment of the inventive concept.

Referring to FIG. 22, the computing system 800 may include a memory system 810, a processor 820, a RAM 830, an input/output (I/O) device 840, and a power supply device 850. The memory system 810 may include a memory device 811 and a memory controller 822. Although not illustrated in FIG. 22, the computing system 800 may further include ports capable of communicating with a video card, a sound card, a memory card, or a USB device, or other electronic devices. The computing system 800 may be embodied as a PC, or a portable electronic device such as a notebook computer, a mobile phone, a personal digital assistant (PDA), or a camera.

The processor 820 may perform particular calculations or tasks. In one or more embodiments, the processor 820 may be a micro-processor, a Central Processing Unit (CPU), or the like. The processor 820 may perform communication with the RAM 830, the I/O device 840, and the memory system 810 via a bus 860 such as an address bus, a control bus, or a data bus. Here, the memory system 810 and/or the RAM 830 may be embodied by using the embodiments shown in FIGS. 1 through 19.

In one or more embodiments, the processor 820 may also be connected to an extended bus such as a Peripheral Component Interconnect (PCI) bus.

The RAM 830 may store data for operations of the computing system 800. As described above, the memory device according to the one or more embodiments of the inventive concept may be applied to the RAM 830. Alternatively, a DRAM, a mobile DRAM, an SRAM, a PRAM, an FRAM, or an MRAM may be used as the RAM 830.

The I/O device 840 may include an input unit such as a keyboard, a keypad, or a mouse, and an output unit such as a printer or a display. The power supply device 850 may supply an operating voltage for the operations of the computing system 800.

While the inventive concept has been particularly shown and described with reference to exemplary embodiments thereof, it will be understood that various changes in form and details may be made therein without departing from the scope of the following claims.

What is claimed is:

1. An operating method for a resistive memory device comprising a memory cell array, the method comprising:
   detecting a write cycle;
   determining whether to perform a recovery operation by comparing the detected write cycle with a first reference value; and
   upon determining to perform the recovery operation, performing the recovery operation on target memory cells of the memory cell array, wherein the recovery operation comprises applying a recovery pulse to the target memory cells, wherein the recovery pulse is greater than a reset write pulse normally applied during a reset write operation.

2. The operating method of claim 1, wherein detecting the write cycle comprises:
   increasing a write cycle count value indicating the write cycle when a write command is received, and resetting the write cycle count value upon performing the recovery operation; and
   comparing the detected write cycle with the first reference value comprises comparing the write cycle count value to the first reference value.

3. The operating method of claim 1, wherein the memory cell array comprises a plurality of memory cell regions and the method further comprises:
   receiving a write command and a corresponding write address, and checking one or more bits of the write address to identify a memory cell region among the plurality of memory cell regions, and
   the performing of the recovery operation on the target memory cells of the memory cell array comprises performing the recovery operation on the memory cells of only the identified memory cell region.

4. The operating method of claim 1, wherein the memory cell array comprises a plurality of memory cell regions and the method further comprises:
   receiving a write command and a corresponding write address, and checking one or more bits of the write address to identify at least two of the plurality of memory cell regions, and
   the performing of the recovery operation on the target memory cells of the memory cell array comprises sequentially performing the recovery operation on memory cells of the at least two of the plurality of memory cell regions.

5. The operating method of claim 1, wherein the memory cell array comprises a plurality of memory cell regions and at least one of the plurality of memory cell regions includes a reference memory cell, the detecting of the write cycle comprises counting a number of write operations directed to the reference memory cell, and the determining of whether to perform the recovery operation by comparing the detected write cycle with a first reference value comprises comparing the number of write operations directed to the reference memory cell with the first reference value.

6. The operating method of claim 5, wherein the recovery operation is performed on only memory cells of the at least one of the plurality of memory cell regions including the reference memory cell.

7. The operating method of claim 1, wherein the recovery operation further comprises:

temporarily storing read data stored in the target memory cells; and after applying the recovery pulse to the target memory cells, re-writing the temporarily-stored read data to the target memory cells.

8. An operating method for a resistive memory device comprising a memory cell array, the method comprising:

receiving a write command directed to target memory cells of the memory cell array and corresponding write data;

retrieving read data from the target memory cells during a write verification operation;

performing error detection on the retrieved read data to generate an error detection result; and determining of whether or not to perform a recovery operation for the target memory cells based on the error detection result, wherein the recovery operation comprises;

applying a recovery pulse to the target memory cells, wherein the recovery pulse is greater than a reset write pulse normally applied during a reset write operation.

9. The operating method of claim 8, wherein the error detection result comprises a number of reset fail bits.

10. An operating method for a resistive memory device comprising a memory cell array, the method comprising:

detecting a write cycle;

determining whether to perform a recovery operation on target memory cells of the memory cell array by comparing the detected write cycle with a first reference value; and upon determining to perform the recovery operation, performing a first recovery operation by applying a first recovery pulse to the target memory cells, the first recovery pulse having a first pulse width and a first pulse level, and thereafter performing a second recovery operation by applying a second recovery pulse to the target memory cells, the second recovery pulse having a second pulse width and a second pulse level, wherein at least one of the first recovery pulse and second recovery pulse is greater than a reset write pulse normally applied during a reset write operation, and at least one of the first pulse width is different from the second pulse width, and the first pulse level is different from the second pulse level.

11. The operating method of claim 10, wherein the memory cell array comprises a plurality of memory cell regions, and the target memory cells include memory cells selected from one of a number of memory cell groupings including; all memory cells of the memory cell array, all memory cells of only one of the plurality of memory cell regions, and one memory cell of the memory cells of the memory cell array.

12. The operating method of claim 10, wherein the performing of the first recovery operation and the performing of the second recovery operation are respectively triggered by one of a write cycle count for the target memory cells exceeding a first reference value, and a number of errors detected in data stored in the target memory cells exceeding a second reference value.

13. The operating method of claim 12, wherein a determination of the write cycle count for the target memory cells exceeding the first reference value is made in response to a received write command.

14. The operating method of claim 12, wherein a determination of the number of errors detected in the data stored in the target memory cells exceeding the second reference value is made during a read operation or a write verification operation.

15. An operating method for a resistive memory device including a memory cell array, the operating method comprising:

obtaining read data stored in at least one target memory cell among target memory cells of the memory cell array in response to a first command;

detecting a number of errors in the read data;

determining whether to perform a recovery operation on the target memory cells by comparing the number of errors in the read data with a reference value; and upon determining to perform the recovery operation, performing the recovery operation on the target memory cells by applying a recovery pulse to the target memory cells, wherein the recovery pulse is greater than a reset write pulse normally applied during a reset write operation.

16. The operating method of claim 15, wherein the first command is a read command.

17. The operating method of claim 15, wherein the first command is a write command, and the obtaining of the read data comprises performing a verification read operation in response to the write command.

18. The operating method of claim 15, wherein the number of errors in the read data are a number of reset fail bits in the read data.

19. The operating method of claim 15, wherein the memory cell array comprises a plurality of memory cell regions, and the target memory cells are memory cells in only one of the plurality of memory cell regions.

20. The operating method of claim 15, wherein the target memory cells are all memory cells in memory cell array.

* * * * *